(12) United States Patent
Cao et al.

(10) Patent No.: US 12,347,921 B2
(45) Date of Patent: Jul. 1, 2025

(54) DISPLAY AND ELECTRONIC DEVICE

(71) Applicant: HUAWEI TECHNOLOGIES CO., LTD., Guangdong (CN)

(72) Inventors: Huajun Cao, Shenzhen (CN); Guozhong Ma, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 292 days.

(21) Appl. No.: 17/704,328

(22) Filed: Mar. 25, 2022

(65) Prior Publication Data

US 2022/0216599 A1  Jul. 7, 2022

Related U.S. Application Data

(63) Continuation of application No. PCT/CN2020/091110, filed on May 19, 2020.

(30) Foreign Application Priority Data

Sep. 27, 2019 (CN) .......................... 201910926875.7

(51) Int. Cl.
 *H01Q 1/24* (2006.01)
 *H04M 1/02* (2006.01)
 *H10H 20/857* (2025.01)
 *H10H 29/14* (2025.01)

(52) U.S. Cl.
 CPC .......... *H01Q 1/243* (2013.01); *H04M 1/0266* (2013.01); *H10H 20/857* (2025.01); *H10H 29/142* (2025.01)

(58) Field of Classification Search
 CPC ........ H01Q 1/243; H01Q 21/062; H01Q 1/36; H01Q 9/285; H01L 27/156; H01L 33/62; H04M 1/026
 See application file for complete search history.

(56) References Cited

U.S. PATENT DOCUMENTS

| | | | |
|---|---|---|---|
| 9,006,661 B1 | 4/2015 | Newman et al. | |
| 11,804,660 B2 * | 10/2023 | Gu | ........................ G06F 1/1698 |
| 2011/0320295 A1 * | 12/2011 | Johnson, Jr. | ........... G07G 1/009 705/17 |

(Continued)

FOREIGN PATENT DOCUMENTS

| | | |
|---|---|---|
| CN | 103515693 A | 1/2014 |
| CN | 106932947 A | 7/2017 |

(Continued)

*Primary Examiner* — Doon Y Chow
(74) *Attorney, Agent, or Firm* — WOMBLE BOND DICKINSON (US) LLP

(57) ABSTRACT

Embodiments of this application disclose a display and an electronic device. The display has a plurality of pixels arranged in an array, each pixel includes a light-transmitting region and a light-shielded region, and each light-transmitting region is provided with a plurality of micro light-emitting diodes. The display includes a plurality of antenna elements, and the plurality of antenna elements are arranged in light-shielded regions of the plurality of pixels. The antenna elements of the display can perform communication in space above the display and have sufficient clearance space during communication, and therefore can obtain good communication quality.

18 Claims, 17 Drawing Sheets

(56) References Cited

U.S. PATENT DOCUMENTS

| | | | | |
|---|---|---|---|---|
| 2015/0029064 A1* | 1/2015 | Pan | ...................... | H01Q 1/22 |
| | | | | 343/769 |
| 2015/0084829 A1* | 3/2015 | Jenwatanavet | ...... | H01Q 9/0407 |
| | | | | 343/876 |
| 2018/0175268 A1* | 6/2018 | Moon | ..................... | H01L 27/15 |
| 2018/0275789 A1* | 9/2018 | Chai | ....................... | H01Q 1/48 |
| 2019/0198979 A1 | 6/2019 | Cao et al. | | |
| 2019/0250470 A1 | 8/2019 | Huang et al. | | |
| 2020/0020288 A1* | 1/2020 | Huang | ................ | G09G 3/2003 |
| 2020/0209928 A1* | 7/2020 | Tsai | ....................... | H01Q 7/00 |

FOREIGN PATENT DOCUMENTS

| | | | |
|---|---|---|---|
| CN | 106950748 | A | 7/2017 |
| CN | 108520722 | A | 9/2018 |
| CN | 109765734 | A | 5/2019 |
| CN | 109786396 | A | 5/2019 |
| CN | 110083280 | A | 8/2019 |
| CN | 110246450 | A | 9/2019 |
| CN | 110740200 | A | 1/2020 |

\* cited by examiner

DISPLAY AND ELECTRONIC DEVICE

CROSS-REFERENCE TO RELATED APPLICATIONS

This application is a continuation of International Application No. PCT/CN2020/091110, filed on May 19, 2020, which claims priority to Chinese Patent Application No. 201910926875.7, filed on Sep. 27, 2019. The disclosures of the aforementioned applications are hereby incorporated by reference in their entireties.

TECHNICAL FIELD

Embodiments of this application relate to the technical field of electronic products, and in particular to a display and an electronic device.

BACKGROUND

With the continuous development of the information era, electronic devices such as mobile phones, by virtue of their advantages such as being fast and portable, have quickly become important communication tools for people to communicate with each other. As a part for receiving and transmitting signals in a mobile phone, an antenna plays a key role in ensuring communication quality and implementing instant communication. Due to an increasing screen-to-body ratio, insufficient antenna clearance is apt to occur in a traditional layout of the antenna, resulting in poor antenna performance.

SUMMARY

Embodiments of this application provide a display and an electronic device. The display is integrated with antenna elements, and the antenna elements can perform communication in space above the display and have sufficient clearance space during communication, and therefore can obtain good communication quality.

According to a first aspect, an embodiment of this application provides a display. The display can be applied to an electronic device. The display has a plurality of pixels arranged in an array, and each pixel includes a light-transmitting region and a light-shielded region. Each light-transmitting region is provided with a plurality of micro light-emitting diodes. The display includes a plurality of antenna elements, and the plurality of antenna elements are arranged in light-shielded regions of the plurality of pixels.

In an embodiment, the display is integrated with at least one antenna by disposing the plurality of antenna elements in the plurality of pixels, and the antenna elements can perform communication in space above the display and have sufficient clearance space during communication. Therefore, the antenna of the electronic device has good communication quality. In addition, because the antenna in the display can effectively enhance and improve electromagnetic wave radiation and reception in a thickness direction of the electronic device, a probability of death grip of the electronic device can be effectively reduced, and user experience can be effectively improved. Moreover, the display integrates a display function and an antenna communication function, and therefore has a high integration degree and helps the electronic device become smaller, lighter, and thinner.

With reference to the first aspect, in a first possible embodiment, the display further includes a radio frequency front-end circuit, and the radio frequency front-end circuit is arranged in the light-shielded regions. One antenna is connected to one radio frequency front-end circuit, or a plurality of antennas are connected to a same radio frequency front-end circuit. Each antenna includes one or more antenna elements. The radio frequency front-end circuit includes an active component. The radio frequency front-end circuit includes some or all parts of a radio frequency front-end module of an antenna module of the electronic device. In other words, the radio frequency front-end circuit is the radio frequency front-end module or a portion of the radio frequency front-end module.

In an embodiment, the display is integrated with the radio frequency front-end circuit, the radio frequency front-end circuit is the radio frequency front-end module of the electronic device or a portion of the radio frequency front-end module, and therefore a transmission distance of a radio frequency signal of the electronic device between the antenna and the radio frequency front-end module is very short. As a result, a loss of the antenna can be reduced and efficiency of the antenna can be improved.

In addition, a manner in which the radio frequency front-end circuit drives the antenna may be: one radio frequency front-end circuit drives one antenna, or one radio frequency front-end circuit drives a plurality of antennas. In a solution in which one radio frequency front-end circuit drives one antenna, a control circuit of the radio frequency front-end circuit is relatively simple and easy to implement. In a solution in which one radio frequency front-end circuit drives a plurality of antennas, there are fewer radio frequency front-end circuits, and therefore costs of the display can be reduced. In addition, the fewer radio frequency front-end circuits occupy less space of the light-shielded regions of the plurality of pixels, and space released can be used for cabling or the antenna elements of the display, so that the design scheme of the display can be more flexible.

In addition, the antenna may have different structures through a combination of one or more antenna elements, thereby meeting different antenna communication requirements.

With reference to the first possible embodiment of the first aspect, in a second possible embodiment, the radio frequency front-end circuit includes a duplexer, a transmit switch, a receive switch, and a switch controller. The duplexer is connected to one or more antennas, and the duplexer is configured to isolate a transmit signal from a receive signal. The transmit switch and the receive switch are located in different branches and are both connected to the duplexer, the transmit switch is configured to transmit the transmit signal when turned on, and the receive switch is configured to transmit the receive signal when turned on. The switch controller is connected to the transmit switch and the receive switch, and the switch controller is configured to control the transmit switch and the receive switch under the driving of an external signal.

In an embodiment, the radio frequency front-end circuit can isolate the transmit signal from the receive signal through a component such as the duplexer, so as to improve sensitivity, a gain, and the like of the antenna.

With reference to the second possible embodiment of the first aspect, in a third possible embodiment, when a plurality of antennas are connected to a same radio frequency front-end circuit, the radio frequency front-end circuit further includes an antenna switch, the antenna switch is connected between the plurality of antennas and the duplexer, and the antenna switch is configured to control on or off of each antenna. The switch controller is further connected to the antenna switch, and the switch controller is further configured to control the antenna switch under the driving of an external signal.

In an embodiment, the radio frequency front-end circuit can control a gating status of a plurality of antennas in an antenna array through the antenna switch, so that communication performance of the antenna array meets requirements.

With reference to any one of the first possible embodiment of the first aspect to the third possible embodiment of the first aspect, in a fourth possible embodiment, the display includes a drive circuit layer, a connection layer, and a component layer that are stacked in sequence. The drive circuit layer includes an antenna data line, and the antenna data line is located in the light-shielded regions of the plurality of pixels. The connection layer includes the antenna elements and a third-type pad connected to the antenna data line. The component layer includes the radio frequency front-end circuit, and the radio frequency front-end circuit is connected to the antenna elements and the third-type pad.

In an embodiment, layer positions of the antenna data line, the antenna elements, and the radio frequency front-end circuit are arranged properly on the display to meet connection requirements of these parts, and fully utilize internal space of the display, thereby avoid an increase in a quantity of layers of the display. This helps the display become lighter and thinner.

In an embodiment, a thickness of an antenna element is greater than that of the third-type pad. In this case, the antenna element is relatively thick, to meet transmission and reception performance requirements of the antenna, increase bandwidth of the antenna, and reduce thermal resistance of the antenna. The antenna element can be formed through a sputtering or evaporation process.

With reference to the fourth possible embodiment of the first aspect, in a fifth possible embodiment, the drive circuit layer further includes a display data line, and the display data line is located in the light-shielded regions of the plurality of pixels. The connection layer further includes a second-type pad connected to the display data line. The component layer further includes the micro light-emitting diode and a pixel driving circuit, and the pixel driving circuit is connected to the second-type pad and the micro light-emitting diode.

In an embodiment, the pixel driving circuit and the radio frequency front-end circuit are arranged at a same layer. The radio frequency front-end circuit and the pixel driving circuit share a portion of thickness space of the display, thereby helping reduce a thickness of the display. Both the radio frequency front-end circuit and the pixel driving circuit may be assembled to the display through a surface-mount technology.

In an embodiment, each pixel driving circuit is connected to a plurality of micro light-emitting diodes in one or more pixels. A manner in which the pixel driving circuit drives a pixel may be: one pixel driving circuit drives one pixel, or one pixel driving circuit drives a plurality of pixels. In the solution in which one pixel driving circuit drives one pixel, a control circuit of the pixel driving circuit is relatively simple, and therefore the pixel driving circuit features a relatively easy manufacturing process and low costs. In a solution in which one pixel driving circuit drives a plurality of pixels, there are fewer pixel driving circuits, and therefore the costs of the display can be reduced. In addition, the fewer pixel driving circuits occupy less space of the light-shielded regions of the plurality of pixels, and space released can be used for cabling or the antenna elements of the display, so that the design scheme of the display can be more flexible.

In an embodiment, the drive circuit layer further includes a power line. The connection layer further includes a first-type pad connected to the power line. The micro light-emitting diodes are connected to the first-type pad. The pixel driving circuit is connected to the first-type pad. The radio frequency front-end circuit is connected to the first-type pad.

In an embodiment, the display further includes a substrate. The substrate is located on a side of the drive circuit layer away from the connection layer. The substrate may be made of a material such as polyimide (PI) or silicon.

In an embodiment, the display further includes an insulation layer. The insulation layer is located between the drive circuit layer and the connection layer. A plurality of via hole structures are provided in the insulation layer, to implement connection between the drive circuit layer, and the first-type pad, the second-type pad, and the third-type pad. The insulation layer can be made of silicon nitride or an organic material. The organic material includes but is not limited to a polyacrylate material.

In an embodiment, the display further includes a package layer. The package layer is located on a side of the component layer away from the connection layer. The package layer is configured to ward off vapor and oxygen to protect an internal structure of the display.

In an embodiment, the display may further include a flat layer. The flat layer is located between the component layer and the package layer. The flat layer covers the component layer to form a flat surface on a side away from the component layer, so that a manufacturing or assembly process of a subsequent film layer is less difficult. The flat layer is made of an insulating material.

In an embodiment, the display may further include an optical film layer. The optical film layer is located between the flat layer and the package layer. The optical film layer is configured to improve and optimize optical characteristics of the display.

With reference to the fifth possible embodiment of the first aspect, in a sixth possible embodiment, the connection layer further includes a first lead and a second lead, the pixel driving circuit and the micro light-emitting diode are connected through the first lead, and the radio frequency front-end circuit and the antenna elements are connected through the second lead.

In an embodiment, the first lead and the second lead are disposed at the connection layer on the display, the first lead may directly connect the pixel driving circuit and the micro light-emitting diodes, and the second lead may directly connect the radio frequency front-end circuit and the antenna elements. Therefore, there is no need to provide an additional via hole structure at the insulation layer. As a result, the structure of the display is simplified, and the costs of the display lower are reduced.

With reference to any one of the first possible embodiment of the first aspect to the third possible embodiment of the first aspect, in a seventh possible embodiment, the display includes at least one antenna array, and each antenna array includes a plurality of antennas. When the plurality of antennas are connected to a same radio frequency front-end circuit, the plurality of antennas connected to the same radio frequency front-end circuit are located in a same antenna array.

In an embodiment, a surface area of the display is relatively large, and therefore the at least one antenna array is integrated into the display, to fully utilize the space above the display for communication. The antenna array includes the plurality of antennas, and the antenna array may form a multiple-input multiple-output system, thereby increasing a channel capacity and improving communication quality of the antenna.

In addition, each radio frequency front-end circuit drives one antenna array, and when there are a plurality of antenna arrays, the plurality of antenna arrays can be independently controlled by different radio frequency front-end circuits, so that the plurality of antenna arrays are free to work independently or jointly. This makes the design scheme of the antenna of the electronic device more diversified. Because the plurality of antennas in the antenna array are connected to the same radio frequency front-end circuit, the radio frequency front-end circuit gates one or more antennas in the antenna array and turns off remaining antennas, so that communication performance of the antenna array meets requirements.

In an embodiment, the antenna may be a dipole antenna. The antenna includes two symmetrically arranged antenna elements; or the antenna includes two symmetrically arranged antenna element groups, and each antenna element group includes a plurality of antenna elements.

In an embodiment, when the antenna includes two symmetrically arranged antenna elements, a structure of the antenna is relatively simple and easy to implement. When the antenna includes two symmetrically arranged antenna element groups, a plurality of antenna elements in a same antenna element group perform signal transmission and reception together, so that the antenna can meet transmission and reception requirements for a larger channel capacity. In other embodiments, the antenna may alternatively be a monopole antenna, an F antenna, or the like.

With reference to any one of the first aspect, or the first possible embodiment of the first aspect to the third possible embodiment of the first aspect, in an eighth possible embodiment, a single antenna element is arranged in a light-shielded region of one pixel, or a single antenna element is contiguously arranged in light-shielded regions of at least two adjacent pixels.

When a single element is arranged in a light-shielded region of one pixel, the antenna element that can be arranged in the light-shielded region of the one pixel has a small volume, and therefore the antenna element can be more easily arranged in the display, so as to reduce design difficulty of the display. In addition, due to the small volume of the antenna element, a larger quantity of antenna elements can be arranged in the display, so that one or more antenna elements can form more antennas of diverse types, and antenna design schemes of the electronic device are more abundant.

When a single antenna element is contiguously arranged in light-shielded regions of at least two adjacent pixels, because the single antenna element can be arranged in space of the light-shielded regions of the at least two pixels, a size and a shape of the antenna element are less limited by a size and a shape of the light-shielded region of the pixel. The size and the shape of the antenna element may be set in a larger region according to communication requirements of the antenna, so that the design of the antenna is more diversified and flexible.

In an embodiment, the antenna element may be linear, L-shaped, inverted L-shaped, or the like.

According to a second aspect, an embodiment of this application further provides an electronic device, including a housing and the display described above, and the display is mounted to the housing. In an embodiment, the display of the electronic device is integrated with an antenna having a communication function, and the antenna does not need to occupy additional space of the electronic device. Therefore, this helps the electronic device become smaller, lighter, and thinner. In addition, the antenna can perform communication directly in space above the display, and the antenna has sufficient clearance space during communication, thereby improving communication quality of the electronic device.

BRIEF DESCRIPTION OF DRAWINGS

To describe the technical solutions in the embodiments of this application or in the background, the following briefly describes the accompanying drawings for describing the embodiments of this application or the background.

DETAILED DESCRIPTION OF EMBODIMENTS

The following describes the embodiments of this application with reference to the accompanying drawings in the embodiments of this application.

Figure 1:
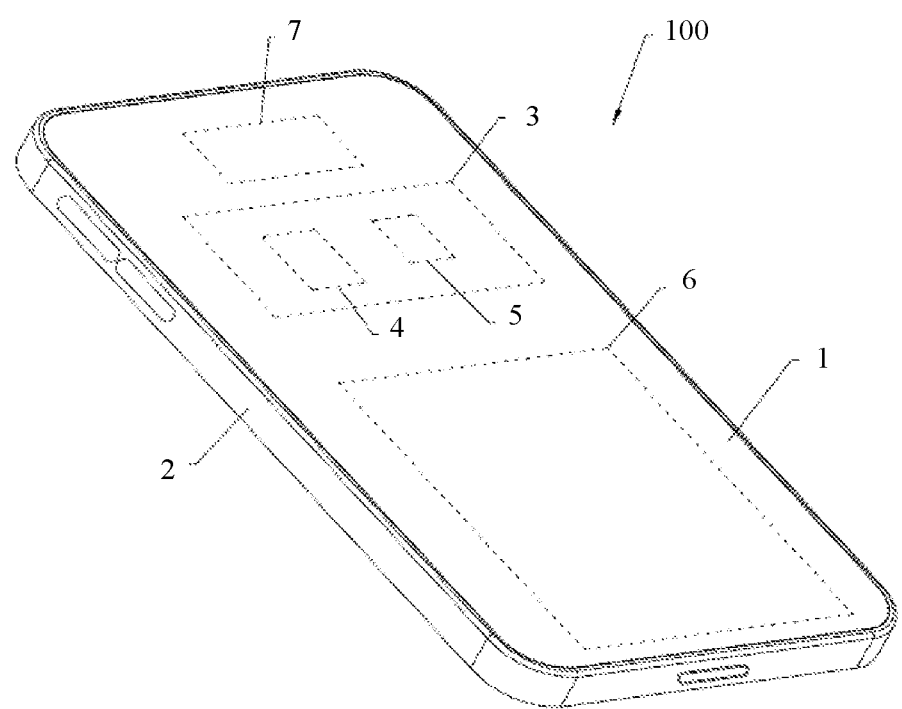
FIG. 1 is a schematic structural diagram of an electronic device according to an embodiment of this application.

Referring to FIG. 1, FIG. 1 is a schematic structural diagram of an electronic device 100 according to an embodiment of this application. The electronic device 100 may be a device such as a mobile phone, a tablet computer, an e-reader, a notebook computer, a vehicle-mounted device, a wearable device, or a television. In description of the embodiments of this application, the electronic device 100 is, for example, a mobile phone.

The electronic device 100 includes a display 1, a housing 2, a circuit board 3, a processor 4, a memory 5, and a battery 6. The display 1 is configured to display an image, a video, and the like. The display 1 is mounted to the housing 2. The display 1 and the housing 2 jointly enclose an inner cavity of the electronic device 100. The circuit board 3, the processor 4, and the battery 6 are accommodated in the inner cavity. The processor 4 and the memory 5 are secured to the circuit board 3. The memory 5 is configured to store computer program code. The computer program code includes a computer instruction. The processor 4 is configured to invoke the computer instruction to enable the electronic device 100 to perform a corresponding operation. The battery 6 is configured to supply power to an electrical part of the electronic device 100.

The electronic device 100 may further include modules such as a camera module, a facial recognition module, a fingerprint recognition module, a sensor module, a motor, a microphone module, and a speaker module that are accommodated in the inner cavity. The display 1 and the modules such as the camera module, the facial recognition module, the fingerprint recognition module, the sensor module, the motor, the microphone module, and the speaker module are all electrically connected to the processor 4. The camera module is configured to perform shooting. The facial recognition module is configured to collect a facial image of a user. The fingerprint recognition module is configured to collect a fingerprint image of a user. The sensor module may include one or more of a pressure sensor, a gyro sensor, a barometric pressure sensor, a magnetic sensor, an acceleration sensor, a distance sensor, an optical proximity sensor, a fingerprint sensor, a temperature sensor, a touch sensor, and an ambient light sensor. The motor can generate a vibration prompt. The motor can be used for an incoming call vibration prompt, and can also be used for touch vibration feedback. The microphone module is configured to convert a sound signal into an electrical signal. The speaker module is configured to convert an electrical signal into a sound signal.

Figure 2:
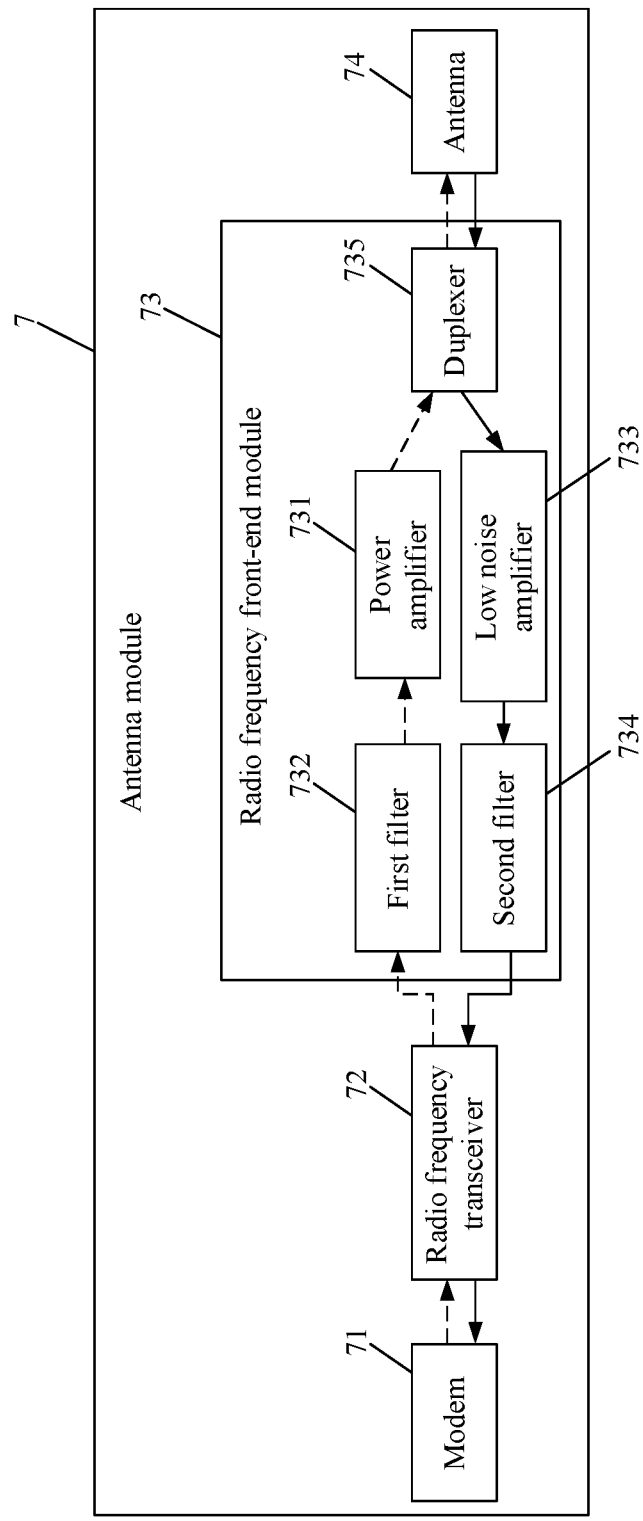
FIG. 2 is a schematic block diagram of an antenna module of the electronic device shown in FIG. 1.

Referring to FIG. 2, FIG. 2 is a schematic block diagram of an antenna module 7 of the electronic device 100 shown in FIG. 1. In FIG. 2, a dashed arrow represents a signal transmission path, and a solid arrow represents a signal reception path.

The electronic device 100 further includes the antenna module 7. The antenna module 7 includes a modem 71, a radio frequency transceiver 72, a radio frequency front-end module 73, and an antenna 74 that are connected in sequence. A block corresponding to the reference numeral 7 in FIG. 1 is only used to indicate that the electronic device 100 includes the antenna module 7, and does not limit an arrangement position, an implementation structure, and the like of the antenna module 7.

The modem 71 includes a modulator and a demodulator. The modulator is configured to modulate a to-be-transmitted low-frequency baseband signal into a medium- and high-frequency signal. The demodulator is configured to demodulate a received medium- and high-frequency signal into a low-frequency baseband signal. The radio frequency transceiver 72 is configured to convert a medium- and high-frequency signal into a to-be-transmitted radio frequency signal, and convert a received radio frequency signal into a medium- and high-frequency signal.

The radio frequency front-end module 73 may mainly include a power amplifier 731, a first filter 732, a low noise amplifier 733, a second filter 734, a duplexer 735, and the like. The power amplifier 731 is configured to amplify a transmit signal. The transmit signal is a radio frequency signal and is transmitted in the transmission path. The first filter 732 is configured to retain a signal within a frequency band in the transmit signal, and filter out a signal outside the frequency band. The low noise amplifier 733 is configured to amplify a receive signal. The receive signal is a radio frequency signal and is transmitted in the reception path. The second filter 734 is configured to retain a signal within a frequency band in the receive signal, and filter out a signal outside the frequency band. The duplexer 735 is configured to isolate the transmit signal from the receive signal. The antenna 74 is configured to convert the transmit signal into an electromagnetic wave signal and send the electromagnetic wave signal out, and is further configured to receive an electromagnetic wave signal and convert the electromagnetic wave signal into the receive signal.

There may be one or more antennas 74. A single antenna 74 may be configured to cover one or more communication frequency bands. For example, the antenna 74 in an embodiment of the application may operate in a Wi-Fi frequency band, a 5G millimeter wave frequency band, and the like. Different antennas 74 may also be reused to improve utilization of the antennas 74. For example, a type of the antenna 74 may be a monopole antenna, a dipole antenna, or an F antenna. The type of the antenna 74 is not strictly limited in this application.

In an embodiment of the application, the display 1 is a micro light-emitting diode (μLED) display. In the electronic device 100, the antenna 74 of the antenna module 7 is integrated into the display 1, so that the antenna 74 can perform communication in space above the display 1 and has sufficient clearance space during communication, to obtain good communication quality.

Figure 3:
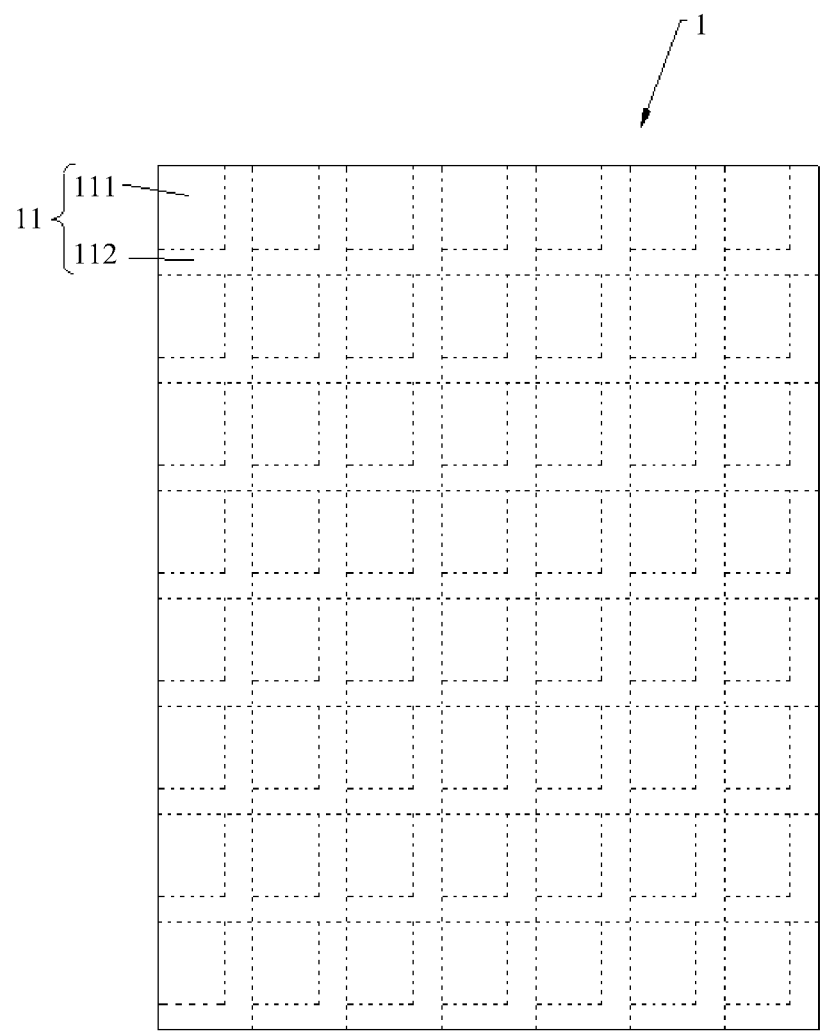
FIG. 3 is a front view of a display of the electronic device shown in FIG. 1.

Referring to FIG. 3, FIG. 3 is a front view of the display 1 of the electronic device 100 shown in FIG. 1.

The display 1 has a plurality of pixels 11 arranged in an array. The display 1 includes a window area and a cabling region, and the cabling region is located at the periphery of the window area. When the display 1 is in operation, the window area is used to display an image. The plurality of pixels 11 are arranged in the window area. A quantity of pixels 11 is related to resolution of the display 1. For example, pixels per inch (PPI) of the display 1 may be less than 1000. Each pixel 11 includes a light-transmitting region 111 and a light-shielded region 112. When the display 1 is in operation, light-transmitting regions 111 of the pixels 11 are used to emit light, and the light emitted by the plurality of pixels 11 together forms a displayed image in the window area; light-shielded regions 112 of the pixels 11 are used to block light, and the light-shielded regions 112 may be used for cabling, components, and the like of the display 1 that need to be shielded.

Figure 4:
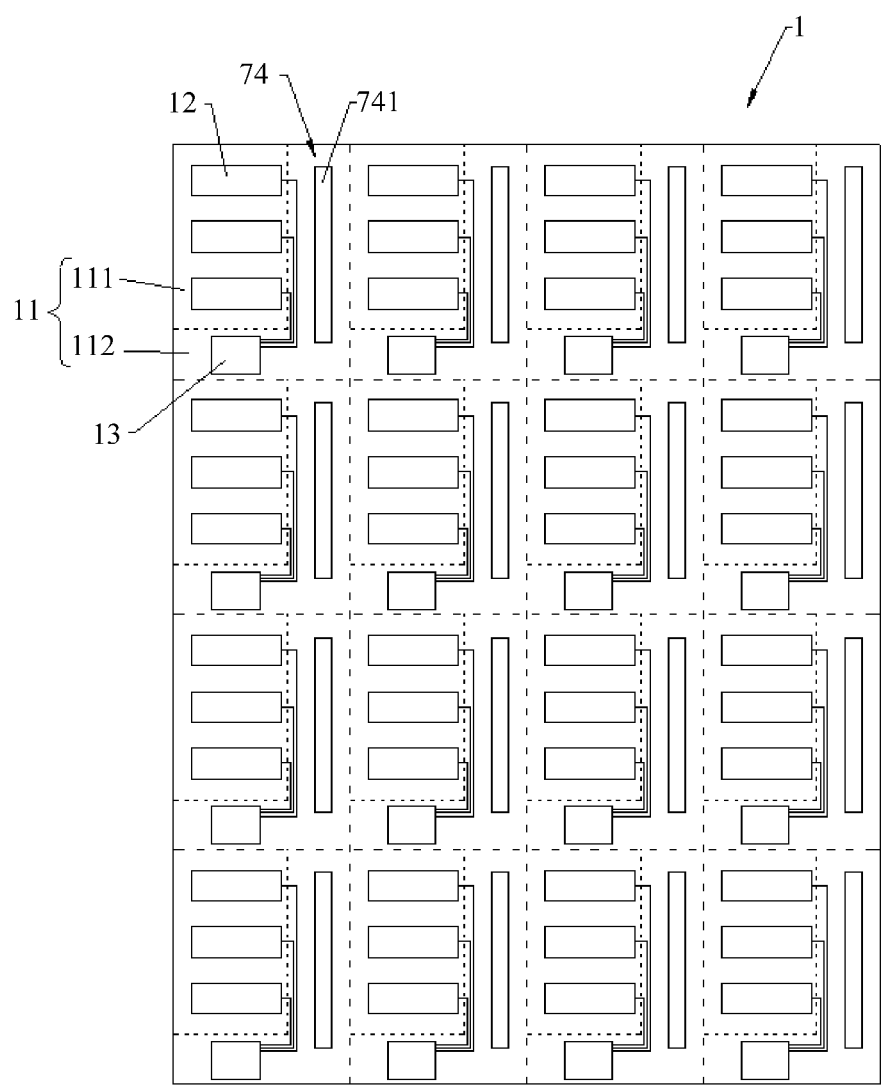
FIG. 4 is a schematic diagram of a partial structure of the display shown in FIG. 3 in an embodiment.

Referring to FIG. 4, FIG. 4 is a schematic diagram of a partial structure of the display 1 shown in FIG. 3 in an embodiment. FIG. 4 illustrates some pixels 11 in the plurality of pixels 11 of the display 1.

Each light-transmitting region 111 of the display 1 is provided with a plurality of micro light-emitting diodes (μLED) 12. A size of the micro light-emitting diode 12 is below 100 micrometers (μm). A plurality of micro light-emitting diodes 12 in a single light-transmitting region 111 may include micro light-emitting diodes of different colors, such as a red micro light-emitting diode, a green micro light-emitting diode, and a blue micro light-emitting diode. In an example, there may be one micro light-emitting diode of one color in a single light-transmitting region 111, so that the display 1 has a simple structure and low costs. In another example, there may be a plurality of micro light-emitting diodes of a same color in a single light-transmitting region 111. The plurality of micro light-emitting diodes of the same color may serve as a backup of each other. When one of the micro light-emitting diodes fails, remaining micro light-emitting diodes can function properly, so that displaying of the display 1 is negligibly affected, and the display 1 has a longer service life.

The display 1 includes a plurality of antenna elements 741. The plurality of antenna elements 741 are arranged in light-shielded regions 112 of the plurality of pixels 11. One or more antenna elements 741 can constitute one antenna 74. In an embodiment, light-shielded regions 112 of some pixels 11 in the plurality of pixels 11 of the display 1 are arranged with antenna elements 741, while light-shielded regions 112 of other pixels 11 are not arranged with antenna elements 741. Light-shielded regions 112 of pixels 11 illustrated in FIG. 4 are arranged with antenna elements 741.

In an embodiment, the display 1 is integrated with at least one antenna 74 by disposing the plurality of antenna elements 741 in the plurality of pixels 11, and the antenna elements 741 can perform communication in space above the display 1 and have sufficient clearance space during communication. Therefore, the antenna 74 of the electronic device 100 has good communication quality. In addition, because the antenna 74 in the display 1 can effectively enhance and improve electromagnetic wave radiation and reception in a thickness direction (a direction perpendicular to the display 1) of the electronic device 100, a probability of death grip of the electronic device 100 can be effectively reduced, and user experience can be effectively improved. Moreover, the display 1 integrates a display function and an antenna communication function, and therefore has a high integration degree and helps the electronic device 100 become smaller, lighter, and thinner.

In an embodiment, as shown in FIG. 4, a single antenna element 741 is arranged in a light-shielded region 112 of one pixel 11. The plurality of antenna elements 741 are respectively arranged in light-shielded regions 112 of a plurality of different pixels 11. The plurality of antenna elements 741 can be arranged in an array.

In an embodiment, the antenna element 741 that can be arranged in the light-shielded region 112 of the one pixel 11 has a small volume, and therefore the antenna element 741 can be more easily arranged in the display 1, so as to reduce design difficulty of the display 1. In addition, due to the small volume of the antenna element 741, a larger quantity of antenna elements 741 can be arranged in the display 1, so that one or more antenna elements 741 can form more antennas 74 of diverse types, and antenna design schemes of the electronic device 100 are more abundant.

In an embodiment, as shown in FIG. 4, the antenna element 741 is straight-lined in an example. In other examples, the antenna element 741 may also be L-shaped, inverted L-shaped, or in other shapes. This is not strictly limited in this application.

In an embodiment, as shown in FIG. 4, the display 1 further includes a plurality of pixel driving circuits 13. The plurality of pixel driving circuits 13 are arranged in the light-shielded regions 112 of the plurality of pixels 11. Each pixel driving circuit 13 is connected to a plurality of micro light-emitting diodes 12 in one pixel 11. In other words, one pixel driving circuit 13 drives one pixel 11. Each pixel 11 includes the plurality of micro light-emitting diodes 12 arranged in the light-transmitting region 111 and a pixel driving circuit 13 arranged in the light-shielded region 112. The pixel driving circuit 13 is configured to control the plurality of micro light-emitting diodes 12. In this case, a control circuit of the pixel driving circuit 13 is relatively simple, and therefore the pixel driving circuit 13 features a relatively easy manufacturing process and low costs. For example, the pixel driving circuit 13 may be a chip structure.

Figure 5:
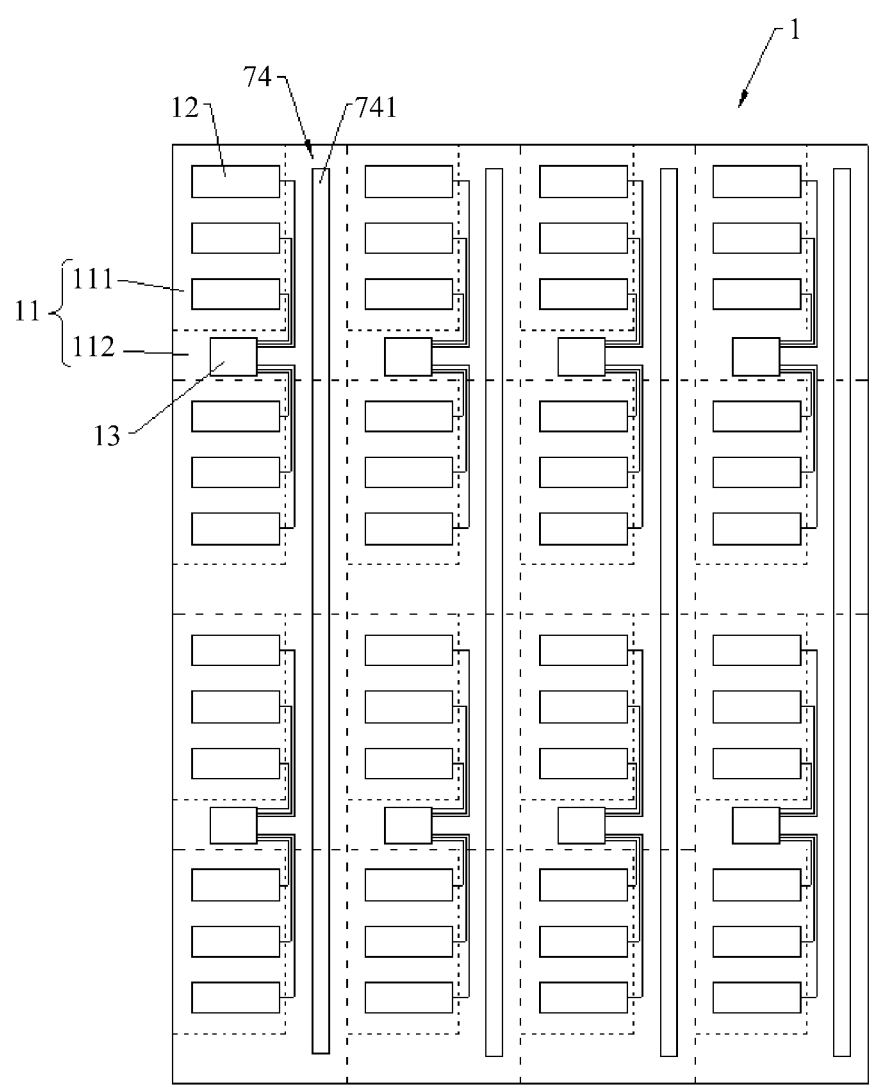
FIG. 5 is a schematic diagram of a partial structure of the display shown in FIG. 3 in another embodiment.

Referring to FIG. 5, FIG. 5 is a schematic diagram of a partial structure of the display 1 shown in FIG. 3 in another embodiment. FIG. 5 illustrates some pixels 11 in the plurality of pixels 11 of the display 1. The following mainly describes differences between the display 1 shown in FIG. 5 and the display 1 shown in FIG. 4, and most of the same technical content thereof is not repeated.

A single antenna element 741 is contiguously arranged in light-shielded regions 112 of at least two adjacent pixels 11. For example, as shown in FIG. 5, a single antenna element 741 is contiguously arranged in light-shielded regions 112 of four adjacent pixels 11. In other examples, a single antenna element 741 may also be arranged in light-shielded regions 112 of another quantity of pixels 11. For example, as shown in FIG. 5, the antenna element 741 is straight-lined. In other examples, the antenna element 741 may also be L-shaped, inverted L-shaped, or in other shapes.

In an embodiment, the single antenna element 741 can be arranged in space of the light-shielded regions 112 of the at least two pixels 11. Therefore, compared with the foregoing embodiment, a size and a shape of the antenna element 741 are less limited by a size and a shape of the light-shielded region 112 of the pixel 11. The size and the shape of the antenna element 741 may be set in a larger region according to communication requirements of the antenna 74, so that an embodiment of the antenna 74 is more diversified and flexible.

In an embodiment, each pixel driving circuit 13 of the display 1 is connected to a plurality of micro light-emitting diodes 12 in a plurality of pixels 11. For example, as shown in FIG. 5, each pixel driving circuit 13 is connected to a plurality of micro light-emitting diodes 12 in two pixels 11. In other examples, each pixel driving circuit 13 may also be connected to a plurality of micro light-emitting diodes 12 of another quantity of pixels 11 (for example, four, eight, or sixteen pixels).

In an embodiment, one pixel driving circuit 13 drives a plurality of pixels. Compared with the foregoing embodiment, there are fewer pixel driving circuits 13, and therefore the costs of the display 1 can be reduced. In addition, the fewer pixel driving circuits 13 occupy less space of the light-shielded regions 112 of the plurality of pixels 11, and space released can be used for cabling or the antenna elements 741 of the display 1, so that the design scheme of the display 1 can be more flexible.

Figure 6:
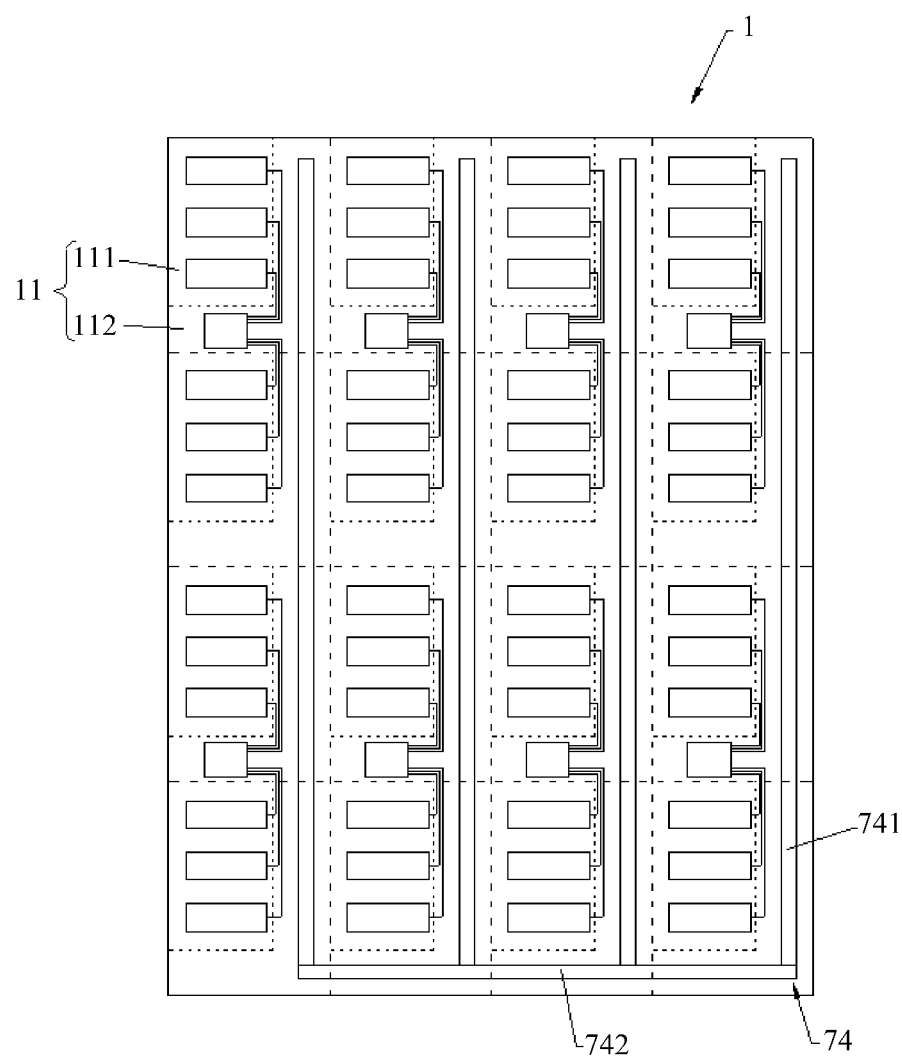
FIG. 6 is a schematic diagram of a partial structure of the display shown in FIG. 3 in still another embodiment.

Referring to FIG. 6, FIG. 6 is a schematic diagram of a partial structure of the display 1 shown in FIG. 3 in still another embodiment. FIG. 6 illustrates some pixels 11 in the plurality of pixels 11 of the display 1. The following mainly describes differences between the display 1 shown in FIG. 6 and the display 1 in the foregoing embodiments, and most of the same technical content thereof is not repeated.

In the embodiments shown in FIG. 4 and FIG. 5, one antenna element 741 constitutes the antenna 74. In an embodiment, a plurality of antenna elements 741 constitute the antenna 74. As shown in FIG. 6, the antenna 74 includes the plurality of antenna elements 741. Each antenna element 741 extends in a first direction, and the plurality of antenna elements 741 are arranged at equal or unequal spacing in a second direction, where the second direction is perpendicular to the first direction.

In an example, as shown in FIG. 6, the antenna 74 further includes a connecting member 742, the connecting member 742 is arranged at a same layer as the plurality of antenna elements 741, and the connecting member 742 connects the plurality of antenna elements 741. For example, the connecting member 742 extends along the second direction and connects the plurality of antenna elements 741. A feedpoint of the antenna 74 may be disposed on the connecting member 742. The connecting member 742 and the plurality of antenna elements 741 may be integrally formed, to simplify a manufacturing process of the display 1.

In another example, the connecting member 742 may be distributed as a conducting wire in other layer structures of the display 1, and the connecting member 742 is connected to the plurality of antenna elements 741 through a plurality of via hole structures.

It can be understood that, if there are a relatively large quantity of antenna elements 741 in the antenna 74 arranged sparsely, and a long connecting member 742 needs to be provided, a phase compensation scheme needs to be considered, to improve and optimize radiation efficiency of the antenna elements 741. However, when there are a relatively small quantity of antenna elements 741 arranged densely, the connecting member 742 is short and a transmission distance of a radio frequency signal is short, and therefore a phase compensation embodiment may not be considered.

It can be understood that, in the foregoing embodiments, the display 1 includes the plurality of antenna elements 741. In other embodiments, the display 1 may alternatively include one antenna element 741. In this case, the antenna element 741 constitutes the antenna 74.

Figure 7:
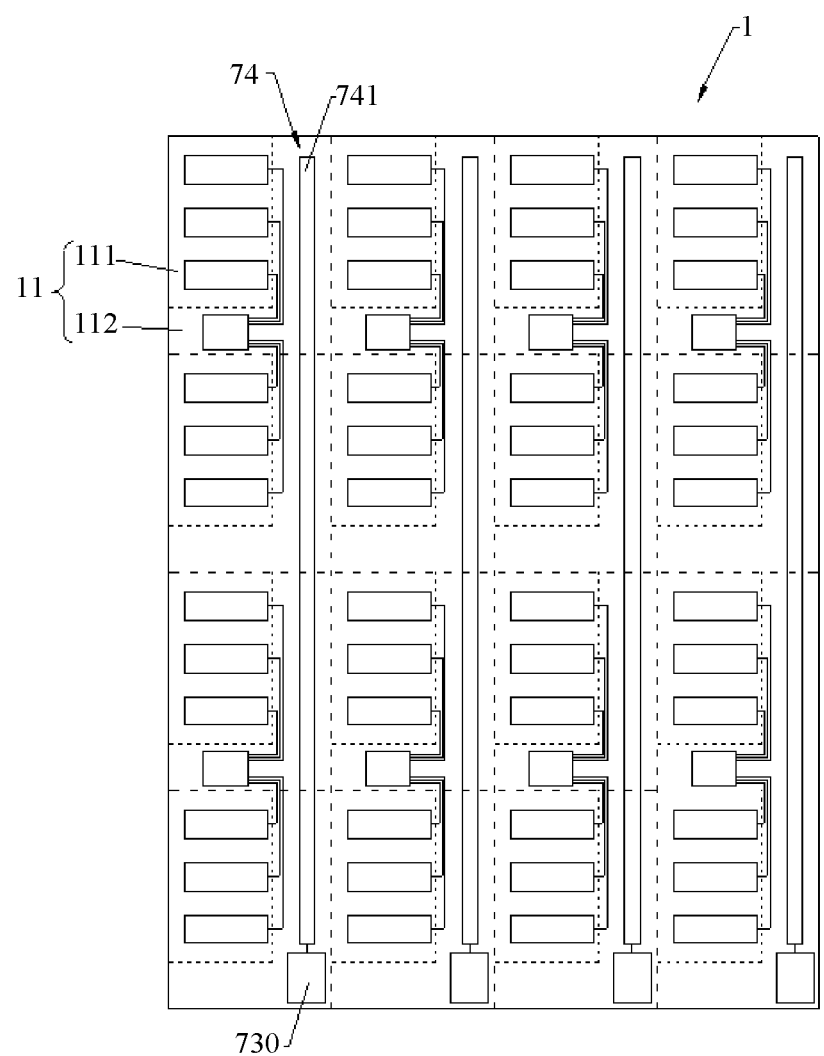
FIG. 7 is a schematic diagram of a partial structure of the display shown in FIG. 3 in still another embodiment.

Referring to FIG. 7, FIG. 7 is a schematic diagram of a partial structure of the display 1 shown in FIG. 3 in still another embodiment. FIG. 7 illustrates some pixels 11 in the plurality of pixels 11 of the display 1. The following mainly describes differences between the display 1 shown in FIG. 7 and the display 1 in the foregoing embodiments, and most of the same technical content thereof is not repeated.

In an embodiment, some components of the radio frequency front-end module 73 (refer to FIG. 2) of the antenna module 7 are further integrated into the display 1 on the electronic device 100. As shown in FIG. 7, the display 1 further includes a radio frequency front-end circuit 730. The radio frequency front-end circuit 730 is arranged in the light-shielded regions 112. One antenna 74 is connected to one radio frequency front-end circuit 730. In this case, one radio frequency front-end circuit 730 drives one antenna 74, and a quantity of radio frequency front-end circuits 730 is the same as that of antennas 74, so that a control circuit of the radio frequency front-end circuit 730 is relatively simple and easy to implement. The radio frequency front-end circuit 730 includes an active component. The radio frequency front-end circuit 730 includes some or all parts of the radio frequency front-end module 73 of the antenna module 7 of the electronic device 100. In other words, the radio frequency front-end circuit 730 is the radio frequency front-end module 73 or a portion of the radio frequency front-end module 73. For example, the radio frequency front-end circuit 730 may be of a chip structure.

In an embodiment, the display 1 is integrated with the radio frequency front-end circuit 730, the radio frequency front-end circuit 730 is the radio frequency front-end module 73 or a portion of the radio frequency front-end module 73, and therefore a transmission distance of a radio frequency signal of the electronic device 100 between the antenna 74 and the radio frequency front-end module 73 is very short. As a result, a loss of the antenna 74 can be reduced and efficiency of the antenna 74 can be improved.

Figure 8:
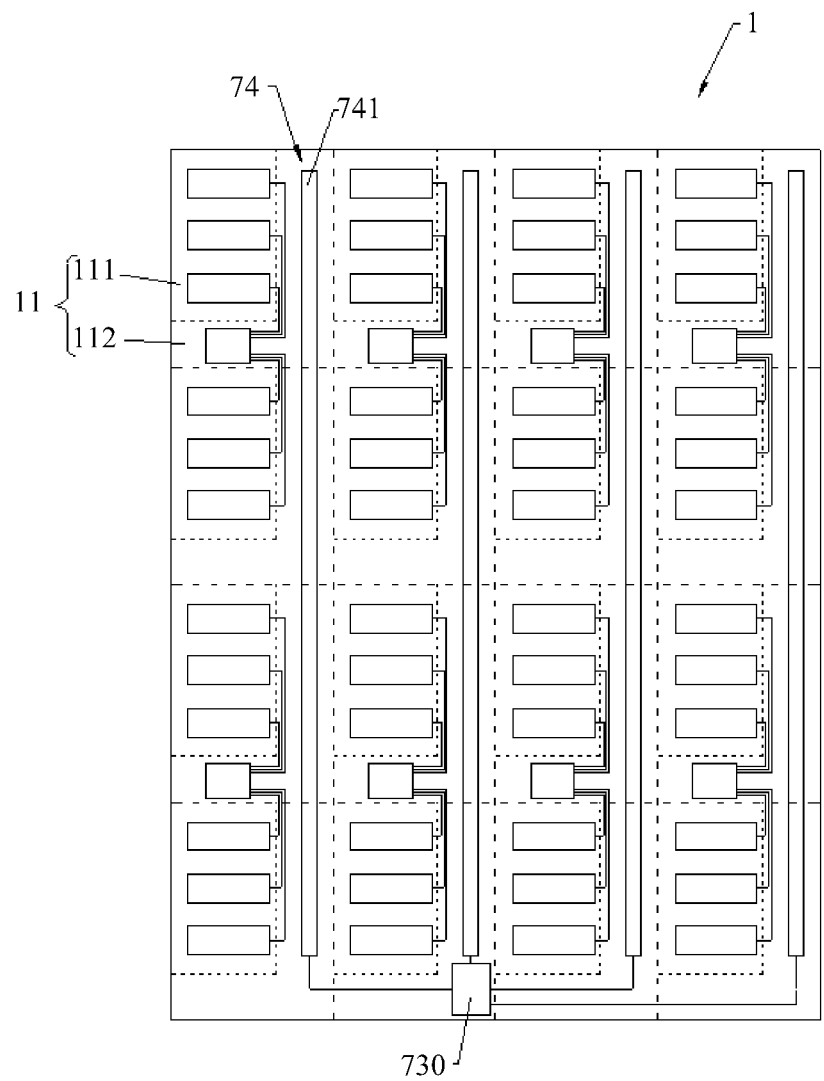
FIG. 8 is a schematic diagram of a partial structure of the display shown in FIG. 3 in still another embodiment.

Referring to FIG. 8, FIG. 8 is a schematic diagram of a partial structure of the display 1 shown in FIG. 3 in still another embodiment. FIG. 8 illustrates some pixels 11 in the plurality of pixels 11 of the display 1. The following mainly describes differences between the display 1 shown in FIG. 8 and the display 1 in the foregoing embodiments, and most of the same technical content thereof is not repeated.

A plurality of antennas 74 are connected to a same radio frequency front-end circuit 730. In an embodiment, one radio frequency front-end circuit 730 drives a plurality of antennas 74. Compared with the foregoing embodiment, there are fewer radio frequency front-end circuits 730, and therefore the costs of the display 1 can be reduced. In addition, the fewer radio frequency front-end circuits 730 occupy less space of the light-shielded regions 112 of the plurality of pixels 11, and space released can be used for cabling or the antenna elements 741 of the display 1, so that the design scheme of the display 1 can be more flexible.

In an embodiment, the radio frequency front-end circuit 730 may be arranged at a same layer as the pixel driving circuit 13. Both the radio frequency front-end circuit 730 and the pixel driving circuit 13 may be assembled to the display 1 through a surface-mount technology. In this case, the radio frequency front-end circuit 730 and the pixel driving circuit 13 share a portion of thickness space of the display 1, thereby helping reduce a thickness of the display 1.

Figure 9:
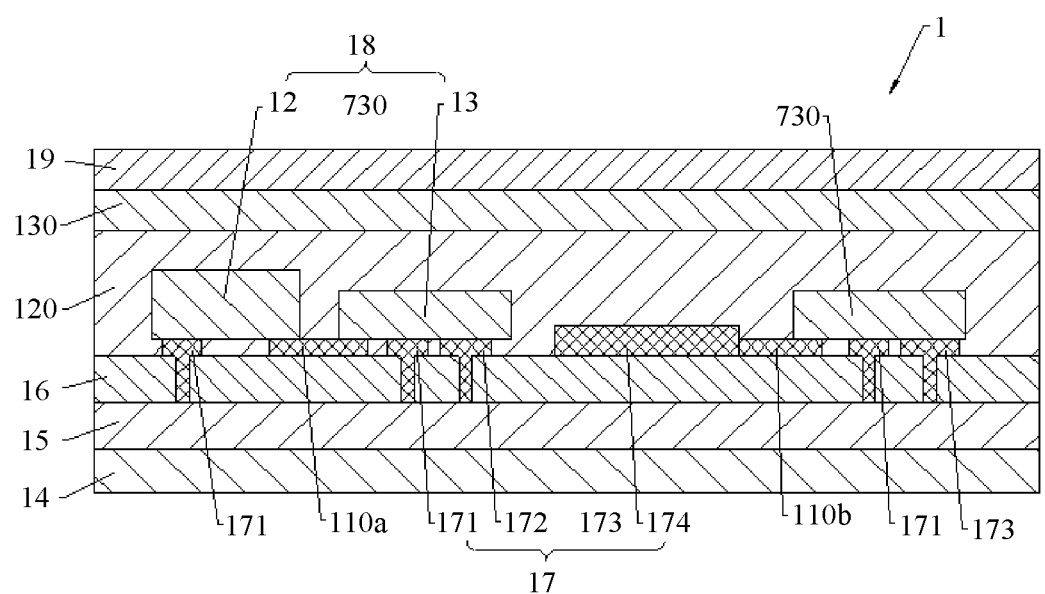
FIG. 9 is a schematic diagram of an internal structure of the display shown in FIG. 3.
Figure 10:
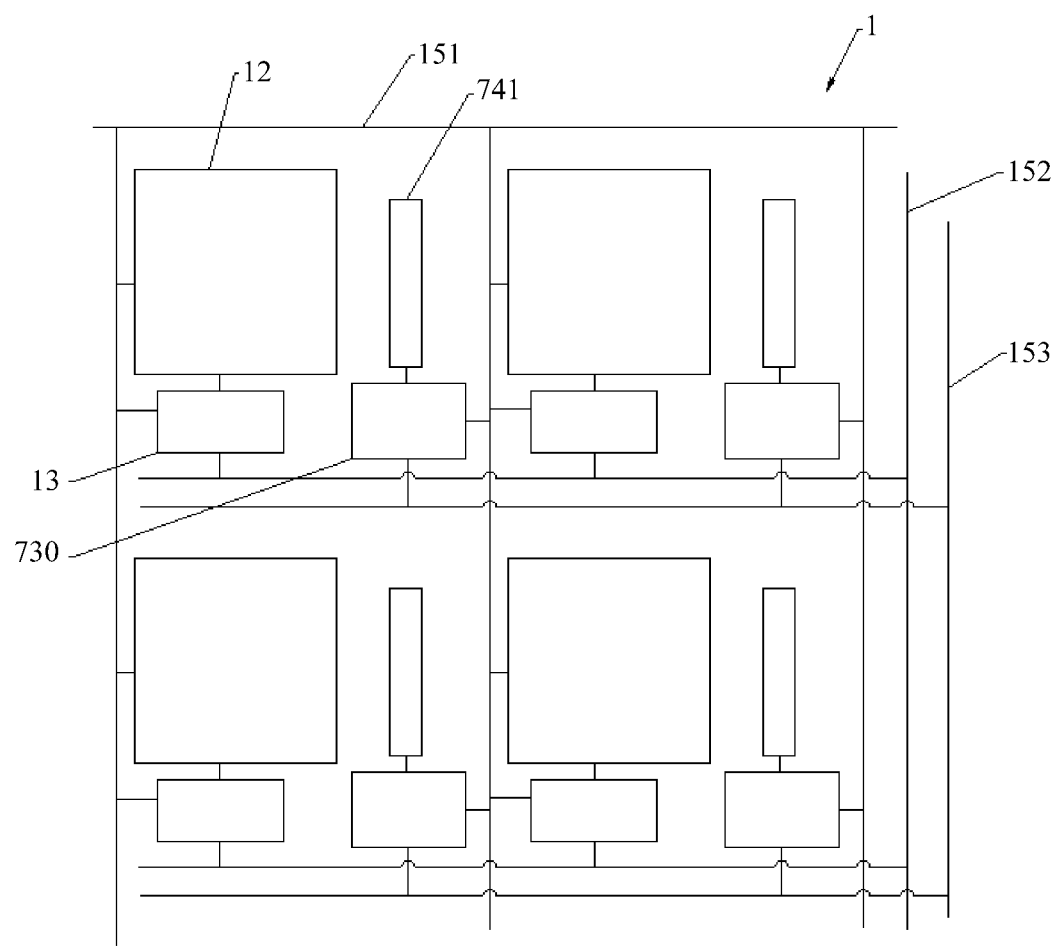
FIG. 10 is a schematic diagram of some circuits of the display shown in FIG. 3.

Referring to FIG. 9 and FIG. 10 together, FIG. 9 is a schematic diagram of an internal structure of the display 1 shown in FIG. 3, and FIG. 10 is a schematic diagram of some circuits of the display 1 shown in FIG. 3. FIG. 9 is mainly used to reflect a relative positional relationship between a plurality of parts located at different layers of the display 1, and a positional relationship between a plurality of parts located at a same layer may be the same as or different from FIG. 9. FIG. 10 is mainly used to reflect a connection relationship between different parts of the display 1, and a quantitative relationship (for example, one-to-one or one-to-many) of the different parts during connection may be the same as or different from FIG. 10.

The display 1 includes a substrate 14, a drive circuit layer 15, an insulation layer 16, a connection layer 17, a component layer 18, and a package layer 19 that are stacked in sequence. The substrate 14 may be made of a material such as polyimide (PI) or silicon. The insulation layer 16 can be made of silicon nitride or an organic material. The organic material includes but is not limited to a polyacrylate material. The package layer 19 is configured to ward off vapor and oxygen to protect the internal structure of the display 1.

The drive circuit layer 15 includes a power line 151, a display data line 152, and an antenna data line 153. The power line 151, the display data line 152, and the antenna data line 153 are located in the light-shielded regions 112 of the plurality of pixels 11.

The connection layer 17 includes a plurality of pads (171, 172, 173) and the antenna elements 741. The plurality of pads (171, 172, 173) are located in the light-shielded regions 112 of the plurality of pixels 11. The plurality of pads (171, 172, 173) include a first-type pad 171 connected to the power line 151, a second-type pad 172 connected to the display data line 152, and a third-type pad 173 connected to the antenna data line 153.

The component layer 18 includes the micro light-emitting diodes 12, the pixel driving circuit 13, and the radio frequency front-end circuit 730. The micro light-emitting diodes 12 are connected to the first-type pad 171. The pixel driving circuit 13 is connected to the first-type pad 171 and the second-type pad 172. The radio frequency front-end circuit 730 is connected to the first-type pad 171 and the third-type pad 173. In other words, the micro light-emitting diodes 12, the pixel driving circuit 13, and the radio frequency front-end circuit 730 each are connected to the power line 151 through the first-type pad 171. The pixel driving circuit 13 is connected to the display data line 152 through the second-type pad 172. The radio frequency front-end circuit 730 is connected to the antenna data line 153 through the third-type pad 173.

In an embodiment, through proper layer distribution of the parts of the display 1, connection requirements can be met, and layers of the display 1 can be reduced. This helps the display 1 become lighter and thinner.

In an embodiment, the display 1 further includes a plurality of leads. The pixel driving circuit 13 and the micro light-emitting diodes 12 may be connected through a lead. The radio frequency front-end circuit 730 and the antenna elements 741 may be connected through a lead.

In an embodiment, the plurality of leads may be arranged at the drive circuit layer 15. In this case, the plurality of leads may be located at a layer of the display 1 different from a layer at which the pixel driving circuit 13, the micro light-emitting diodes 12, the radio frequency front-end circuit 730, and the antenna elements 741 are located. The lead connecting the pixel driving circuit 13 and the micro light-emitting diodes 12 is connected to the pixel driving circuit 13 and the micro light-emitting diodes 12 through different via hole structures provided at the insulation layer 16. The lead connecting the radio frequency front-end circuit 730 and the antenna elements 741 is also connected to the radio frequency front-end circuit 730 and the antenna elements 741 through different via hole structures provided at the insulation layer 16.

In another embodiment, as shown in FIG. 9, a plurality of leads may be arranged at the connection layer 17. In an embodiment, the connection layer 17 further includes a first lead 110a and a second lead 110b. The pixel driving circuit 13 and the micro light-emitting diodes 12 are connected through the first lead 110a, and the radio frequency front-end circuit 730 and the antenna elements 741 are connected through the second lead 110b.

In an embodiment, the first lead 110a and the second lead 110b are disposed at the connection layer 17 on the display 1, the first lead 110a may directly connect the pixel driving circuit 13 and the micro light-emitting diodes 12, and the second lead 110b may directly connect the radio frequency front-end circuit 730 and the antenna elements 741. Therefore, there is no need to provide an additional via hole structure at the insulation layer 16. As a result, the structure of the display 1 is simplified, and the costs of the display 1 are reduced.

In an embodiment, as shown in FIG. 9, a thickness of an antenna element 741 is greater than those of the pads (171, 172, 173). In this case, the antenna element 741 is relatively thick, to meet transmission and reception performance requirements of the antenna 74, increase bandwidth of the antenna 74, and reduce thermal resistance of the antenna 74. The antenna element 741 may be formed through a sputtering or evaporation process.

In an example, the pads (171, 172, 173) and the antenna element 741 may be formed in a same manufacturing process, to simplify manufacturing operations of the display 1 and reduce the costs of the display 1. In another example, the antenna element 741 may be formed in two processes. For example, the pads (171, 172, 173) and a portion of the antenna element 741 (a thickness of this part is the same as those of the pads (171, 172, 173)) are formed in one manufacturing process, and then the other portion of the antenna element 741 is formed in another manufacturing process. In other embodiments, the thickness of the antenna element 741 may alternatively be equal to those of the pads (171, 172, 173).

In an embodiment, as shown in FIG. 9, the display 1 may further include a flat layer 120. The flat layer 120 is located between the component layer 18 and the package layer 19. The flat layer 120 covers the component layer 18 to form a flat surface on a side away from the component layer 18, so that a manufacturing or assembly process of a subsequent film layer is less difficult. The flat layer 120 is made of an insulating material.

In an embodiment, as shown in FIG. 9, the display 1 may further include an optical film layer 130. The optical film layer 130 is located between the flat layer 120 and the package layer 19. The optical film layer 130 is configured to improve and optimize optical characteristics of the display 1.

In other embodiments, the display 1 may not be provided with the pixel driving circuit 13, and the plurality of micro light-emitting diodes 12 of the plurality of pixels 11 may be directly and independently controlled by the display data line 152 in the display 1.

In an embodiment of the application, a surface area of the display 1 is relatively large, and therefore at least one antenna array is integrated into the display 1 of the electronic device 100, to fully utilize the space above the display 1 for communication. Examples are used below for description.

Figure 11:
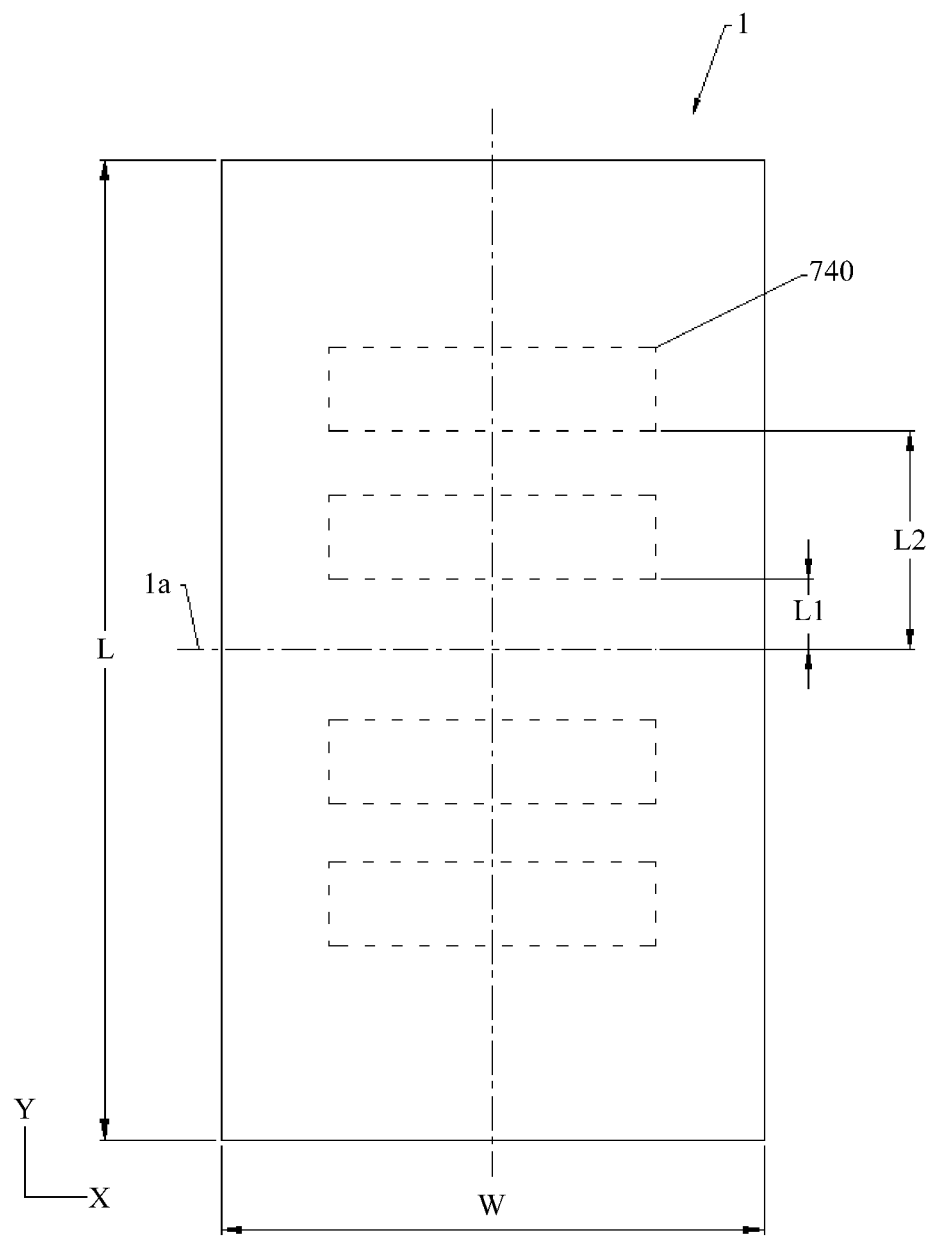
FIG. 11 is a schematic structural diagram of the display shown in FIG. 3 in an example embodiment.

Referring to FIG. 11, FIG. 11 is a schematic structural diagram of the display 1 shown in FIG. 3 in an example embodiment.

The display 1 includes at least one antenna array 740. That the display 1 shown in FIG. 11 includes a plurality of antenna arrays 740 is used as an example for description. As shown in FIG. 11, the display 1 is rectangular. A length L of the display 1 in a length direction Y may be 14.36 cm, and a width W of the display in a width direction X may be 6.464 cm. The display 1 is a 20:9 screen of 6 inches, and pixels per inch of the display 1 may be 508. The display 1 includes four antenna arrays 740. The four antenna arrays 740 are arranged symmetrically about a first center line 1a of the display 1, and the first center line 1a extends along the width direction X in the middle of the display 1. A distance L1 between each of two antenna arrays 740 close to the first center line 1a and the first center line 1a may be 2.0 cm, and a distance L2 between each of two antenna arrays 740 away from the first center line 1a and the first center line 1a may be 4.0 cm.

The plurality of antenna arrays 740 may work independently or jointly.

Figure 12:
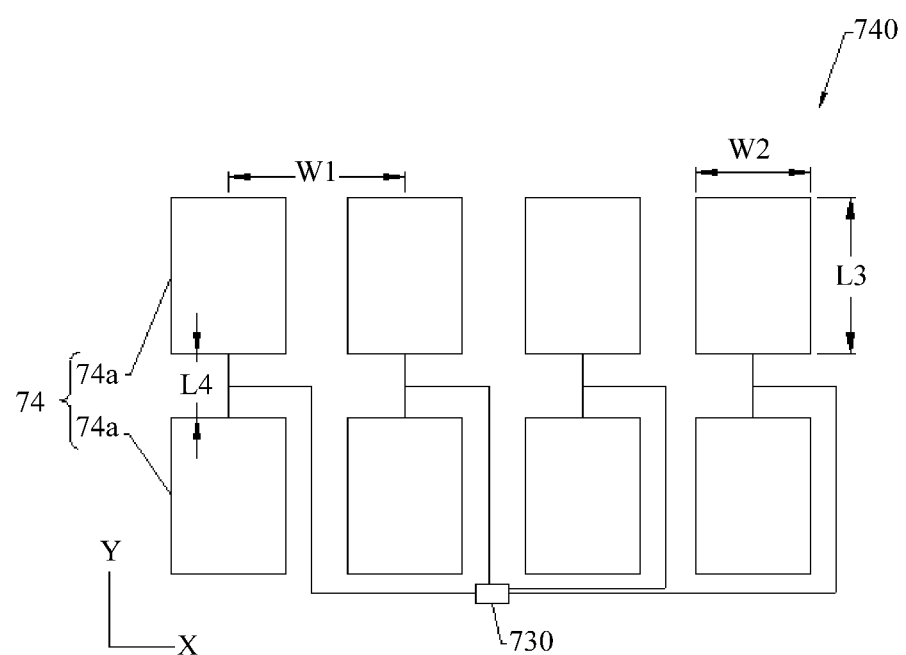
FIG. 12 is a schematic diagram of connection between an antenna array and a radio frequency front-end circuit of the display shown in FIG. 11 in an embodiment.

Referring to FIG. 12, FIG. 12 is a schematic diagram of connection between the antenna array 740 and the radio frequency front-end circuit 730 of the display 1 shown in FIG. 11 in an embodiment.

Each antenna array 740 includes a plurality of antennas 74. For example, as shown in FIG. 12, the antenna array 740 includes four antennas 74. The four antennas 74 are arranged along the width direction X of the display 1. Spacing W1 between centers of two adjacent antennas 74 may be 1.0 cm. The antenna 74 may be a dipole antenna and includes two antenna units 74*a*. A length L3 and a width W2 of the antenna unit 74*a* may be 2.0 mm and 0.77 mm, respectively. A distance L4 between the two antenna units 74*a* may be 1.0 cm.

In an embodiment, the antenna array 740 includes the plurality of antennas 74, and the antenna array 740 may form a multiple-input multiple-output (MIMO) system, thereby increasing a channel capacity and improving communication quality of the antenna.

In an embodiment, each antenna array 740 is connected to one radio frequency front-end circuit 730, and a plurality of antennas 74 in the antenna array 740 are all connected to a same radio frequency front-end circuit 730. In this case, the one radio frequency front-end circuit 730 drives the plurality of antennas 74.

Each radio frequency front-end circuit 730 drives one antenna array 740, and when there are a plurality of antenna arrays 740, the plurality of antenna arrays 740 can be independently controlled by different radio frequency front-end circuits 730, so that the plurality of antenna arrays 740 are free to work independently or jointly. This makes the design scheme of the antenna of the electronic device 100 more diversified.

Figure 13:
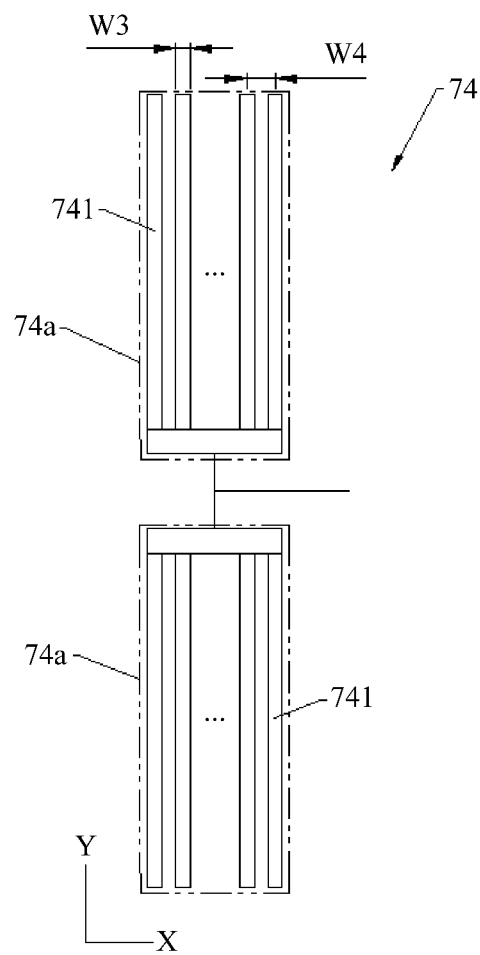
FIG. 13 is a schematic structural diagram of an antenna shown in FIG. 12.

Referring to FIG. 13, FIG. 13 is a schematic structural diagram of the antenna 74 shown in FIG. 12.

In an embodiment, each antenna 74 includes one or more antenna elements 741. The antenna 74 may have different structures through a combination of one or more antenna elements 741, thereby meeting different antenna communication requirements.

In the embodiment shown in FIG. 13, the antenna 74 includes two symmetrically arranged antenna element groups, and each antenna element group includes a plurality of antenna elements 741. That is, one antenna element group forms one antenna unit 74*a*. In this case, a plurality of antenna elements 741 in a same antenna element group perform signal transmission and reception together, so that the antenna 74 meets transmission and reception requirements for a larger channel capacity. A width W3 of a single antenna element 741 is limited by a size of the light-shielded region 112 of the pixel 11. Minimum center spacing between two adjacent antenna elements 741 is limited by a size of the pixel 11. As shown in FIG. 13, the width W3 of the antenna element 741 may be 20 μm, spacing W4 between centers of the two adjacent antenna elements 741 may be 5 μm, and there may 16 antenna elements 741. The thickness of the antenna element 741 may be 10 μm, and a thickness direction of the antenna element 741 is perpendicular to the width direction X and the length direction Y.

In other embodiments, the antenna 74 includes two symmetrically arranged antenna elements 741. That is, one antenna element 741 forms one antenna unit 74*a*. In other embodiments, the antenna 74 may be a monopole antenna, and the antenna 74 may include one antenna element 741.

Figure 14:
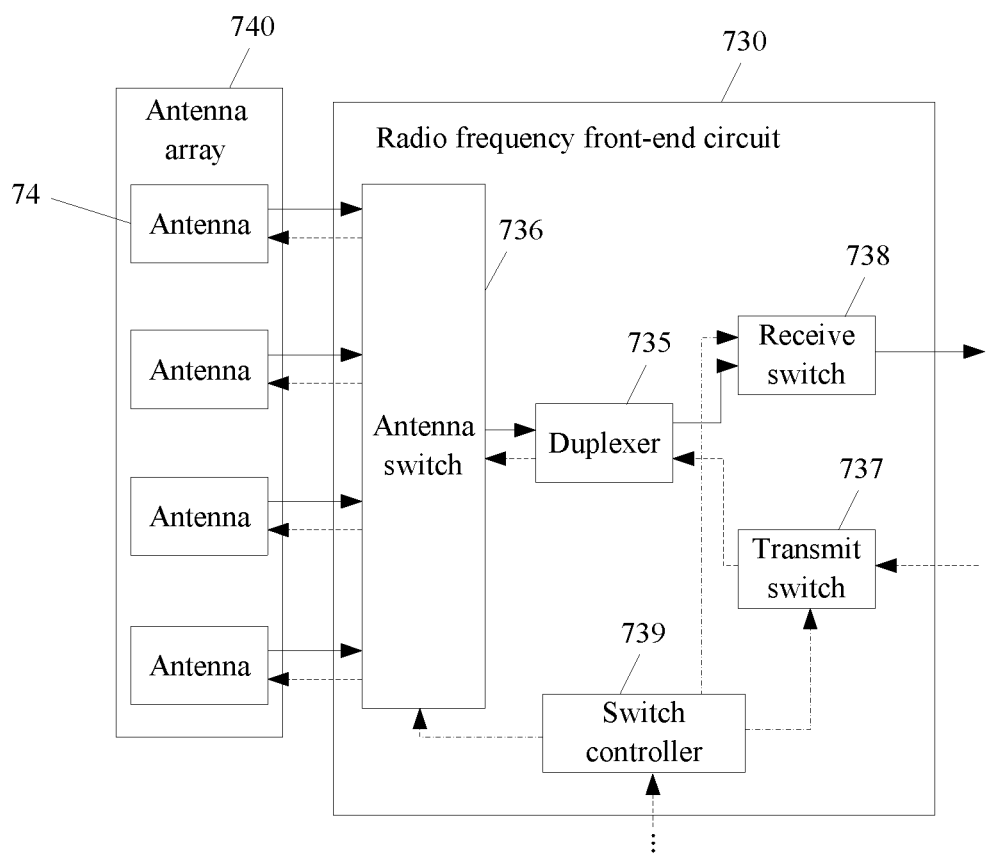
FIG. 14 is a schematic block diagram of the radio frequency front-end circuit shown in FIG. 12 in an embodiment.

Referring to FIG. 14, FIG. 14 is a schematic block diagram of the radio frequency front-end circuit 730 shown in FIG. 12 in an embodiment.

The radio frequency front-end circuit 730 includes an antenna switch 736, a duplexer 735, a transmit switch 737, a receive switch 738, and a switch controller 739. The antenna switch 736 is connected to the plurality of antennas 74 in the antenna array 740, and is configured to control on or off of each antenna 74. The duplexer 735 is connected to the antenna switch 736 and is configured to isolate a transmit signal from a receive signal. The transmit switch 737 and the receive switch 738 are located in different branches and are both connected to the duplexer 735, the transmit switch 737 is configured to transmit the transmit signal when turned on, and the receive switch 738 is configured to transmit the receive signal when turned on. The switch controller 739 is connected to the antenna switch 736, the transmit switch 737, and the receive switch 738. The switch controller 739 is configured to control the antenna switch 736, the transmit switch 737, and the receive switch 738 under the driving of an external signal.

In an embodiment, the radio frequency front-end circuit 730 is a portion of the radio frequency front-end module 73 in FIG. 2, the receive switch 738 is further configured to be connected to the low noise amplifier 733 of the radio frequency front-end module 73 through the antenna data line 153, the transmit switch 737 is further configured to be connected to the power amplifier 731 of the radio frequency front-end module 73 through the antenna data line 153, and the switch controller 739 is further configured to be connected to the processor 4 through the antenna data line 153. The antenna data line 153 can be configured to send a drive signal to the switch controller 739. A plurality of radio frequency front-end circuits 730 may belong to a plurality of branches of a same radio frequency front-end module 73, or may belong to a plurality of different radio frequency front-end modules 73.

For example, an embodiment of this application provides a method for controlling the antenna array 740.

S001: The radio frequency transceiver 72 collects induced currents of the plurality of antennas 74 and transmits the induced currents to the modem 71. The induced currents are generated from electromagnetic waves received by the antennas 74.

S002: The modem 71 converts the induced currents into a digital signal and sends the digital signal to the processor 4.

The switch controller 739 may convert an analog signal (that is, the induced currents) into the digital signal through a digital-to-analog conversion module.

S003: The processor 4 calculates a signal-to-noise ratio of each antenna 74 based on the digital signal.

S004: The processor 4 uses a target function providing a maximum signal-to-noise ratio of an output signal of the antenna array 740 to generate a control signal and send the control signal to the switch controller 739. The processor 4 may first calculate signal-to-noise ratios corresponding to all combinations that can be obtained by the plurality of antennas 74 in the antenna array 740, and then select a combination with a maximum signal-to-noise ratio as a target combination to generate a control signal corresponding to the combination.

S005: The switch controller 739 controls on or off of the plurality of antennas 74 in the antenna array 740 through the antenna switch 736 according to the control signal. In this case, the target combination includes one or more antennas 74 in the antenna array 740 that are in a connected state.

The method for controlling the antenna array 740 is a real-time adjustment method. For example, the switch controller 739 may perform the method for controlling the antenna array 740 once at time intervals (at the millisecond level).

Figure 15:
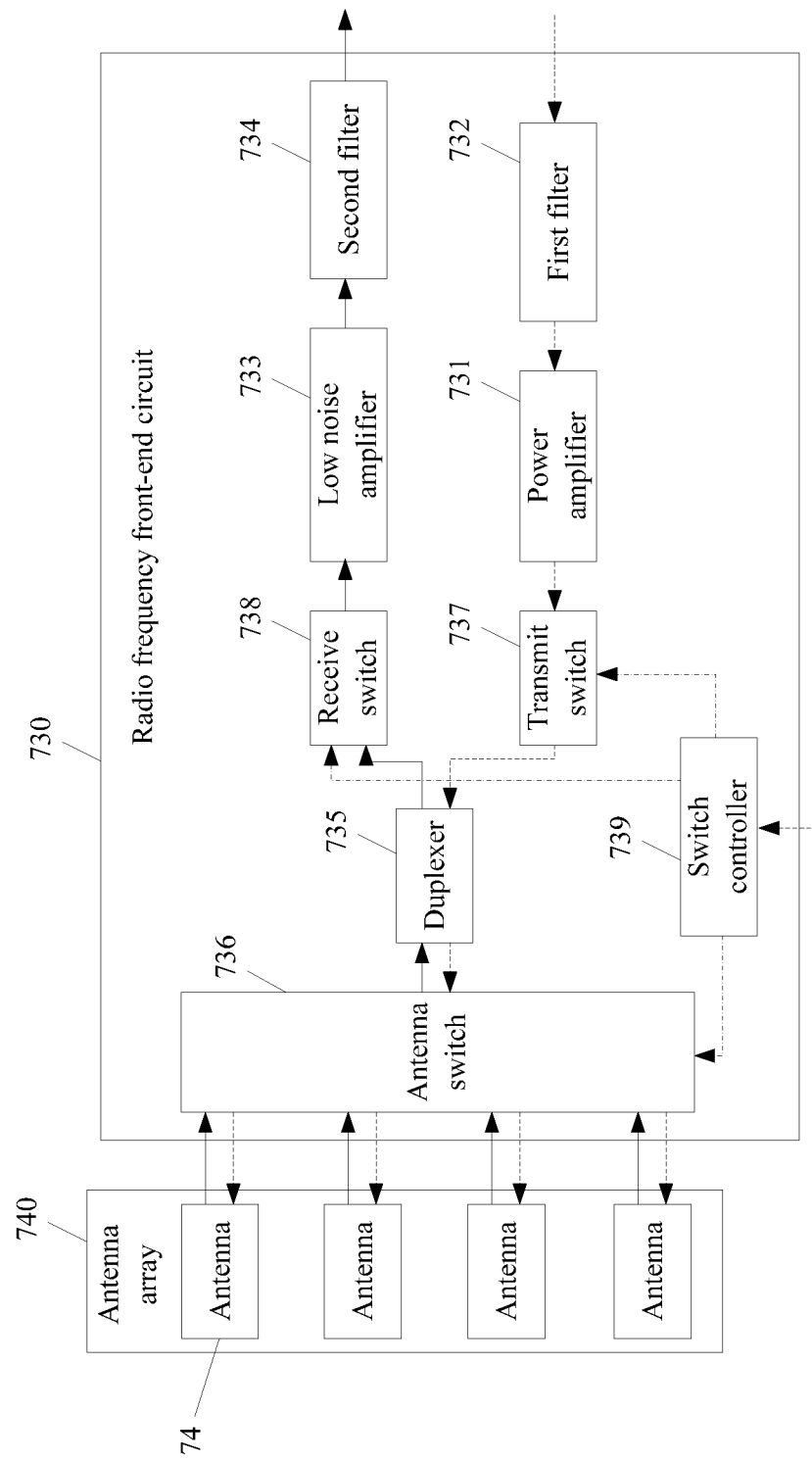
FIG. 15 is a schematic block diagram of the radio frequency front-end circuit shown in FIG. 12 in another embodiment.

Referring to FIG. 15, FIG. 15 is a schematic block diagram of the radio frequency front-end circuit 730 shown in FIG. 12 in another embodiment. This embodiment differs from the embodiment shown in FIG. 14 mainly in that, the radio frequency front-end circuit 730 further includes the power amplifier 731, the first filter 732, the low noise amplifier 733, and the second filter 734. The low noise amplifier 733 and the second filter 734 are located in a branch in which the receive switch 738 is located, and the low noise amplifier 733 is connected to the receive switch 738. The power amplifier 731 and the first filter 732 are located in a branch in which the transmit switch 737 is located, and the power amplifier 731 is connected to the transmit switch 737.

Figure 16:
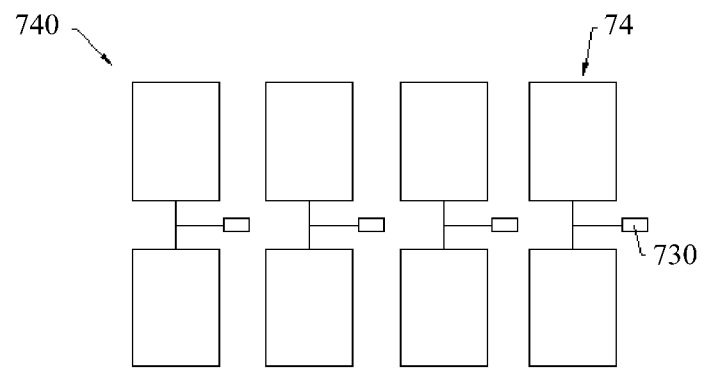
FIG. 16 is a schematic diagram of connection between an antenna array and a radio frequency front-end circuit of the display shown in FIG. 11 in another embodiment.

Referring to FIG. 16, FIG. 16 is a schematic diagram of connection between the antenna array 740 and the radio frequency front-end circuit 730 of the display 1 shown in FIG. 11 in another embodiment. This embodiment differs from the embodiment shown in FIG. 12 mainly in that, each antenna 74 is connected to one radio frequency front-end circuit 730. One radio frequency front-end circuit 730 drives one antenna 74. As shown in FIG. 16, four antennas 74 in the antenna array 740 are respectively connected to four radio frequency front-end circuits 730.

Figure 17:
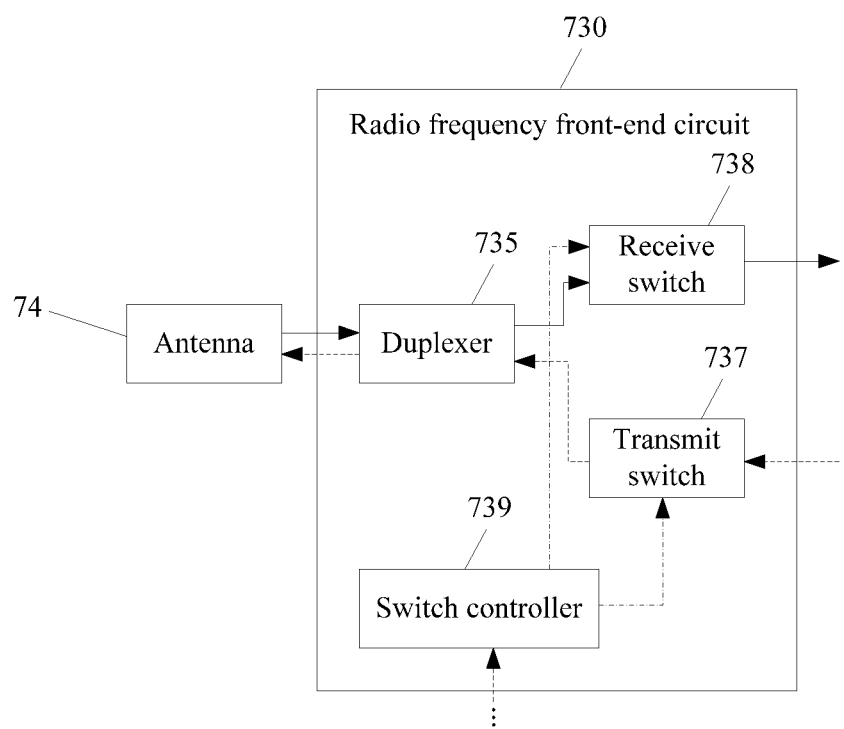
FIG. 17 is a schematic block diagram of the radio frequency front-end circuit shown in FIG. 16 in an embodiment.

Referring to FIG. 17, FIG. 17 is a schematic block diagram of the radio frequency front-end circuit 730 shown in FIG. 16 in an embodiment.

The radio frequency front-end circuit 730 includes a duplexer 735, a transmit switch 737, a receive switch 738, and a switch controller 739. The duplexer 735 is connected to the antenna 74 and is configured to isolate a transmit signal from a receive signal. The transmit switch 737 and the receive switch 738 are located in different branches and are both connected to the duplexer 735, the transmit switch 737 is configured to transmit the transmit signal when turned on, and the receive switch 738 is configured to transmit the receive signal when turned on. The switch controller 739 is connected to the transmit switch 737 and the receive switch 738, and the switch controller 739 is configured to control the transmit switch 737 and the receive switch 738 under the driving of an external signal.

In an embodiment, the radio frequency front-end circuit 730 is a portion of the radio frequency front-end module 73 in FIG. 2, the receive switch 738 is further configured to be connected to the low noise amplifier 733 of the radio frequency front-end module 73 through the antenna data line 153, the transmit switch 737 is further configured to be connected to the power amplifier 731 of the radio frequency front-end module 73 through the antenna data line 153, and the switch controller 739 is further configured to be connected to the processor 4 through the antenna data line 153.

Figure 18:
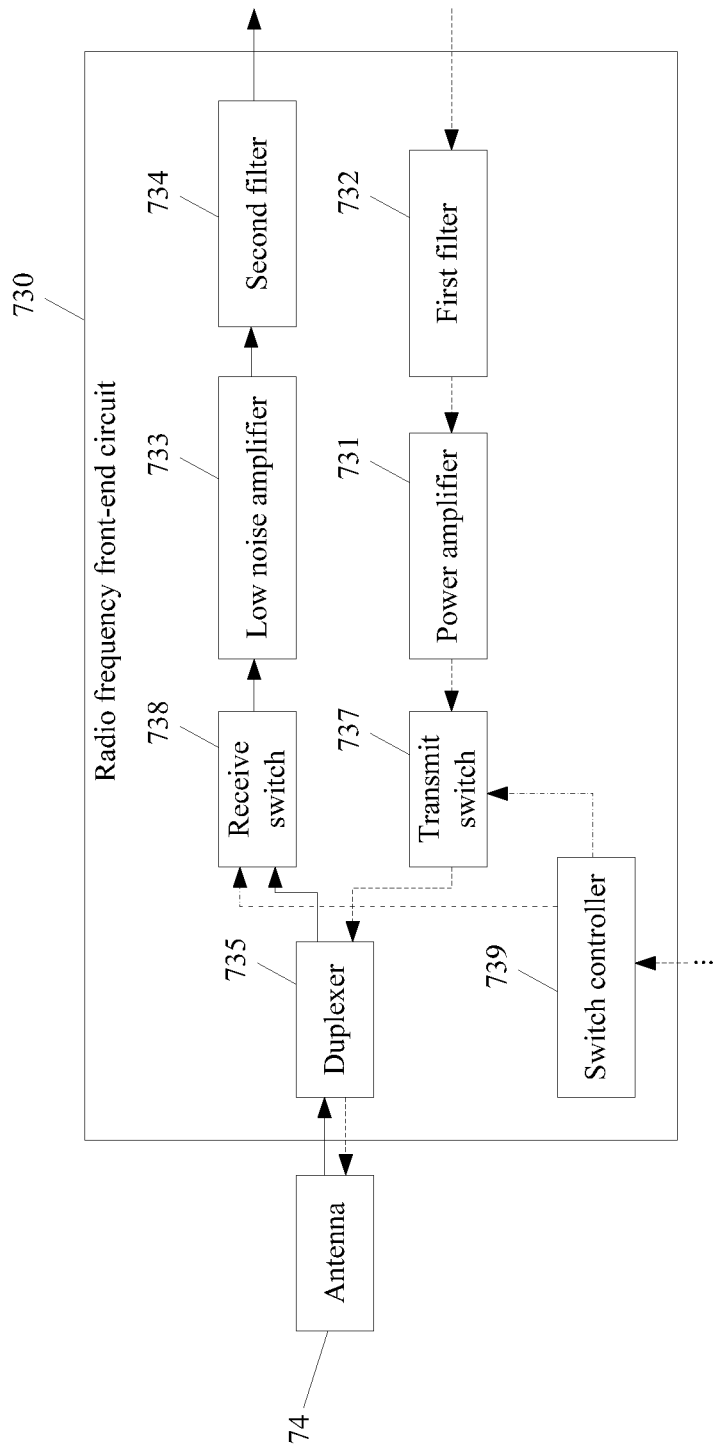
FIG. 18 is a schematic block diagram of the radio frequency front-end circuit shown in FIG. 16 in another embodiment.

Referring to FIG. 18, FIG. 18 is a schematic block diagram of the radio frequency front-end circuit 730 shown in FIG. 16 in another embodiment. This embodiment differs from the embodiment shown in FIG. 17 mainly in that, the radio frequency front-end circuit 730 further includes the power amplifier 731, the first filter 732, the low noise amplifier 733, and the second filter 734. The low noise amplifier 733 and the second filter 734 are located in a branch in which the receive switch 738 is located, and the low noise amplifier 733 is connected to the receive switch 738. The power amplifier 731 and the first filter 732 are located in a branch in which the transmit switch 737 is located, and the power amplifier 731 is connected to the transmit switch 737.

It can be understood that the radio frequency front-end circuit 730 in FIG. 14 and FIG. 15 may be applied to the display 1 shown in FIG. 8. The radio frequency front-end circuit 730 in FIG. 17 and FIG. 18 may be applied to the display 1 shown in FIG. 7.

The foregoing descriptions are merely implementations of this application, but are not intended to limit the protection scope of this application. Any variation or replacement readily figured out by one of ordinary skilled in the art within the technical scope disclosed in this application shall fall within the protection scope of this application. Therefore, the protection scope of this application shall be subject to the protection scope of the claims.

What is claimed is:

1. A display, comprising:
   a plurality of pixels arranged in an array, wherein each pixel comprises a light-transmitting region and a light-shielded region, wherein each light-transmitting region is provided with a plurality of micro light-emitting diodes;
   a plurality of antenna elements arranged in light-shielded regions of the plurality of pixels, wherein the display is integrated at least one antenna by disposing the plurality of antenna elements in the light-shielded regions of the plurality of pixels to improve electromagnetic wave radiation and reception; and
   a radio frequency front-end circuit arranged in the light-shielded regions, wherein an antenna is connected to the radio frequency front-end circuit, the radio frequency front-end circuit drives the antenna, and a quantity of radio frequency front-end circuits is the same as that of antennas, wherein the radio frequency front-end circuit comprises a duplexer, a transmit switch, a receive switch, and a switch controller, wherein the switch controller controls the transmit switch and the receive switch under the driving of an external signal.

2. The display according to claim 1, wherein the antenna is connected to the radio frequency front-end circuit, or a plurality of antennas connected to a same radio frequency front-end circuit, and each antenna comprises one or more antenna elements.

3. The display according to claim 2, wherein:
   the duplexer is connected to one or more antennas, wherein the duplexer is configured to isolate a transmit signal from a receive signal;
   the transmit switch is configured to transmit the transmit signal when turned on;
   the receive switch is configured to transmit the receive signal when turned on, wherein the transmit switch and the receive switch are located in different branches and are both connected to the duplexer; and
   the switch controller is connected to the transmit switch and the receive switch.

4. The display according to claim 3, wherein when the plurality of antennas are connected to a same radio frequency front-end circuit, the radio frequency front-end circuit further comprises:
   an antenna switch connected between the plurality of antennas and the duplexer, wherein the antenna switch is configured to control on or off of each antenna,
   wherein the switch controller is further connected to the antenna switch, and wherein the switch controller is further configured to control the antenna switch under the driving of the external signal.

5. The display according to claim 2, further comprising:
   a drive circuit layer comprising an antenna data line located in the light-shielded regions of the plurality of pixels;
   a connection layer comprising the antenna elements and a third-type pad connected to the antenna data line; and
   a component layer that are stacked in sequence, wherein the component layer comprises the radio frequency front-end circuit connected to the antenna elements and the third-type pad.

6. The display according to claim 5, wherein the drive circuit layer further comprises a display data line located in the light-shielded regions of the plurality of pixels; wherein the connection layer further comprises a second-type pad connected to the display data line; and wherein the component layer further comprises the micro light-emitting diode and a pixel driving circuit connected to the second-type pad and the micro light-emitting diode.

7. The display according to claim 6, wherein the connection layer further comprises a first lead and a second lead, wherein the pixel driving circuit and the micro light-emitting diode are connected through the first lead, and wherein the radio frequency front-end circuit and the antenna element are connected through the second lead.

8. The display according to claim 2, wherein the display comprises at least one antenna array, wherein each antenna array comprises the plurality of antennas, and wherein
when the plurality of antennas are connected to a same radio frequency front-end circuit, the plurality of antennas connected to the same radio frequency front-end circuit are located in a same antenna array.

9. The display according to claim 1, wherein a single antenna element is arranged in a light-shielded region of one pixel, or a single antenna element is contiguously arranged in light-shielded regions of at least two adjacent pixels.

10. An electronic device, comprising:
a housing; and
a display mounted to the housing, wherein the display comprises:
a plurality of pixels arranged in an array, wherein each pixel comprises a light-transmitting region and a light-shielded region, wherein each light-transmitting region is provided with a plurality of micro light-emitting diodes;
a plurality of antenna elements arranged in light-shielded regions of the plurality of pixels, wherein the display is integrated at least one antenna by disposing the plurality of antenna elements in the light-shielded regions of the plurality of pixels to improve electromagnetic wave radiation and reception; and
a radio frequency front-end circuit arranged in the light-shielded regions, wherein an antenna is connected to the radio frequency front-end circuit, the radio frequency front-end circuit drives the antenna, and a quantity of radio frequency front-end circuits is the same as that of antennas, wherein the radio frequency front-end circuit comprises a duplexer, a transmit switch, a receive switch, and a switch controller, wherein the switch controller controls the transmit switch and the receive switch under the driving of an external signal.

11. The electronic device according to claim 10, wherein the antenna is connected to the radio frequency front-end circuit, or a plurality of antennas connected to a same radio frequency front-end circuit, and each antenna comprises one or more antenna elements.

12. The electronic device according to claim 11, wherein:
the duplexer is connected to one or more antennas, wherein the duplexer is configured to isolate a transmit signal from a receive signal;
the transmit switch is configured to transmit the transmit signal when turned on;
the receive switch is configured to transmit the receive signal when turned on, wherein the transmit switch and the receive switch are located in different branches and are both connected to the duplexer; and
the switch controller is connected to the transmit switch and the receive switch.

13. The electronic device according to claim 12, wherein when the plurality of antennas are connected to a same radio frequency front-end circuit, the radio frequency front-end circuit further comprises:
an antenna switch connected between the plurality of antennas and the duplexer, wherein the antenna switch is configured to control on or off of each antenna,
wherein the switch controller is further connected to the antenna switch, and wherein the switch controller is further configured to control the antenna switch under the driving of the external signal.

14. The electronic device according to claim 11, wherein the display further comprises:
a drive circuit layer comprising an antenna data line located in the light-shielded regions of the plurality of pixels;
a connection layer comprising the antenna elements and a third-type pad connected to the antenna data line; and
a component layer that are stacked in sequence, wherein the component layer comprises the radio frequency front-end circuit connected to the antenna elements and the third-type pad.

15. The electronic device according to claim 14, wherein the drive circuit layer further comprises a display data line located in the light-shielded regions of the plurality of pixels; wherein the connection layer further comprises a second-type pad connected to the display data line; and wherein the component layer further comprises the micro light-emitting diode and a pixel driving circuit connected to the second-type pad and the micro light-emitting diode.

16. The electronic device according to claim 15, wherein the connection layer further comprises a first lead and a second lead, wherein the pixel driving circuit and the micro light-emitting diode are connected through the first lead, and wherein the radio frequency front-end circuit and the antenna element are connected through the second lead.

17. The electronic device according to claim 11, wherein the display comprises at least one antenna array, wherein each antenna array comprises the plurality of antennas, and wherein
when the plurality of antennas are connected to a same radio frequency front-end circuit, the plurality of antennas connected to the same radio frequency front-end circuit are located in a same antenna array.

18. The electronic device according to claim 10, wherein a single antenna element is arranged in a light-shielded region of one pixel, or a single antenna element is contiguously arranged in light-shielded regions of at least two adjacent pixels.

* * * * *